(12) United States Patent
Chen et al.

(10) Patent No.: US 9,923,135 B2
(45) Date of Patent: Mar. 20, 2018

(54) LIGHT-EMITTING ASSEMBLY

(71) Applicant: Industrial Technology Research Institute, Hsinchu (TW)

(72) Inventors: Hsin-Chu Chen, Miaoli County (TW); Wen-Yung Yeh, Hsinchu County (TW); Hsuan-Yu Lin, Changhua County (TW); Chun-Ting Liu, Hsinchu County (TW); Wen-Hong Liu, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/293,298

(22) Filed: Oct. 14, 2016

(65) Prior Publication Data

US 2017/0148964 A1 May 25, 2017

Related U.S. Application Data

(60) Provisional application No. 62/278,466, filed on Jan. 14, 2016.

(30) Foreign Application Priority Data

Nov. 23, 2015 (TW) .............................. 104138827 A
Apr. 29, 2016 (CN) ........................... 2016 1 0278151

(51) Int. Cl.
  *H01L 33/62* (2010.01)
  *H01L 33/52* (2010.01)
(52) U.S. Cl.
  CPC .............. *H01L 33/62* (2013.01); *H01L 33/52* (2013.01)
(58) Field of Classification Search
  CPC ..... H01L 33/62; H01L 51/50; H01L 51/5012; H01L 51/52
  See application file for complete search history.

(56) References Cited

U.S. PATENT DOCUMENTS 6,642,618 B2  11/2003  Yagi et al.
8,581,267 B2 * 11/2013  Lester .................... H01L 33/62
                                                          257/88

(Continued)

FOREIGN PATENT DOCUMENTS

CN    102569338    7/2012
CN    103339440   10/2013

(Continued)

OTHER PUBLICATIONS

"Office Action of Taiwan Counterpart Application", dated Jul. 11, 2016, p. 1-p. 4.

*Primary Examiner* — Cuong Q Nguyen
(74) *Attorney, Agent, or Firm* — JCIPRNET

(57) ABSTRACT

A light-emitting assembly includes a first substrate, a first electrode layer, a light-emitting layer, a second electrode layer, a second substrate, a first conductive member and a second conductive member. The first electrode layer, the light-emitting layer and the second electrode layer are sequentially disposed on the first substrate. An area of the second electrode layer is entirely located within an area of the light emitting layer. The second electrode layer is located between the second substrate and the light-emitting layer. The first and second conductive members are disposed between the first and second substrates. The first electrode layer is electrically connected to a first circuit on the second substrate through the first conductive member. The second electrode layer is electrically connected to a second circuit on the second substrate through the second conductive member. The second conductive member is located within the area of the second electrode layer.

24 Claims, 17 Drawing Sheets

(56) References Cited

U.S. PATENT DOCUMENTS

| | | | |
|---|---|---|---|
| 8,836,204 | B2 | 9/2014 | Kagotani et al. |
| 9,035,420 | B2 | 5/2015 | Lee et al. |
| 9,214,510 | B2 | 12/2015 | Ma et al. |
| 2006/0220199 | A1 | 10/2006 | Duboc et al. |
| 2011/0084294 | A1* | 4/2011 | Yao .................. H01L 33/62 257/93 |
| 2011/0156084 | A1 | 6/2011 | Choi et al. |
| 2014/0306214 | A1 | 10/2014 | Lee |
| 2015/0287959 | A1* | 10/2015 | Hanamura .......... H01L 51/5246 257/40 |
| 2016/0141548 | A1* | 5/2016 | Tanaka ............... H01L 51/5246 257/40 |

FOREIGN PATENT DOCUMENTS

| | | |
|---|---|---|
| CN | 104733507 | 6/2015 |
| TW | 200717890 | 5/2007 |
| TW | I351894 | 11/2011 |
| TW | 201210104 | 3/2012 |
| TW | 201220488 | 5/2012 |
| TW | 201409681 | 3/2014 |
| TW | 201508965 | 3/2015 |
| TW | 201521239 | 6/2015 |

* cited by examiner

LIGHT-EMITTING ASSEMBLY

CROSS-REFERENCE TO RELATED APPLICATION

This application claims the priority benefits of U.S. provisional application Ser. No. 62/278,466, filed on Jan. 14, 2016, Taiwan application serial no. 104138827, filed on Nov. 23, 2015, and China application serial no. 201610278151.2, filed on Apr. 29, 2016. The entirety of each of the above-mentioned patent applications is hereby incorporated by reference herein and made a part of this specification.

TECHNICAL FIELD

The disclosure relates to a light-emitting assembly.

BACKGROUND

Organic light-emitting diode (OLED) has some features that cannot be achieved by conventional light sources. For example, the OLED has advantages of high quantum efficiency, large area, power-saving, light in weight, slim in volume and flexible property, etc. However, an organic light-emitting layer in an OLED assembly is liable to be deteriorated due to invasion of moisture and oxygen, which may reduce a service life of the OLED assembly. Therefore, package of the organic light-emitting layer is a very important link in manufacturing of the OLED assembly.

SUMMARY

An embodiment of the disclosure provides a light-emitting assembly including a first substrate, a first electrode layer, a light-emitting layer, a second electrode layer, a second substrate, a first conductive member and a second conductive member. The first electrode layer, the light-emitting layer and the second electrode layer are sequentially disposed on the first substrate. The second substrate has a first circuit and a second circuit. The second electrode layer is located between the second substrate and the light-emitting layer. The first conductive member is disposed between the first substrate and the second substrate. The first electrode layer is electrically connected to the first circuit on the second substrate through the first conductive member. The second conductive member is disposed between the first substrate and the second substrate. The second electrode layer is electrically connected to the second circuit on the second substrate through the second conductive member, where the second conductive member is located within an area of the second electrode layer.

An embodiment of the disclosure provides a light-emitting assembly including a first substrate, a first electrode layer disposed on the first substrate, a light-emitting layer disposed on the first electrode layer, a second electrode layer disposed on the light-emitting layer, a second substrate having a first circuit and a second circuit, a first conductive member disposed between the first substrate and the second substrate, and a second conductive member disposed between the first substrate and the second substrate. An area of the second electrode layer is entirely located within an area of the light-emitting layer. The second electrode layer is located between the second substrate and the light-emitting layer. The first electrode layer is electrically connected to the first circuit on the second substrate through the first conductive member. The second electrode layer is electrically connected to the second circuit on the second substrate through the second conductive member, and the second conductive member is located within the area of the second electrode layer. The second conductive member has a contact terminal, the contact terminal is proximate to the second electrode layer, and the contact terminal includes a first material layer, a second material layer and a third material layer sequentially stacked from the second substrate towards the second electrode layer.

An embodiment of the disclosure provides a light-emitting assembly including a first substrate, a first electrode layer disposed on the first substrate, a light-emitting layer disposed on the first electrode layer, a second electrode layer disposed on the light-emitting layer, a second substrate having a first circuit and a second circuit, a first conductive member disposed between the first substrate and the second substrate, a second conductive member disposed between the first substrate and the second substrate, and a third substrate located between the second substrate and the second electrode layer. An area of the second electrode layer is entirely located within an area of the light-emitting layer. The second electrode layer is located between the second substrate and the light-emitting layer. The first electrode layer is electrically connected to the first circuit on the second substrate through the first conductive member. The second electrode layer is electrically connected to the second circuit on the second substrate through the second conductive member, and the second conductive member is located within the area of the second electrode layer.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
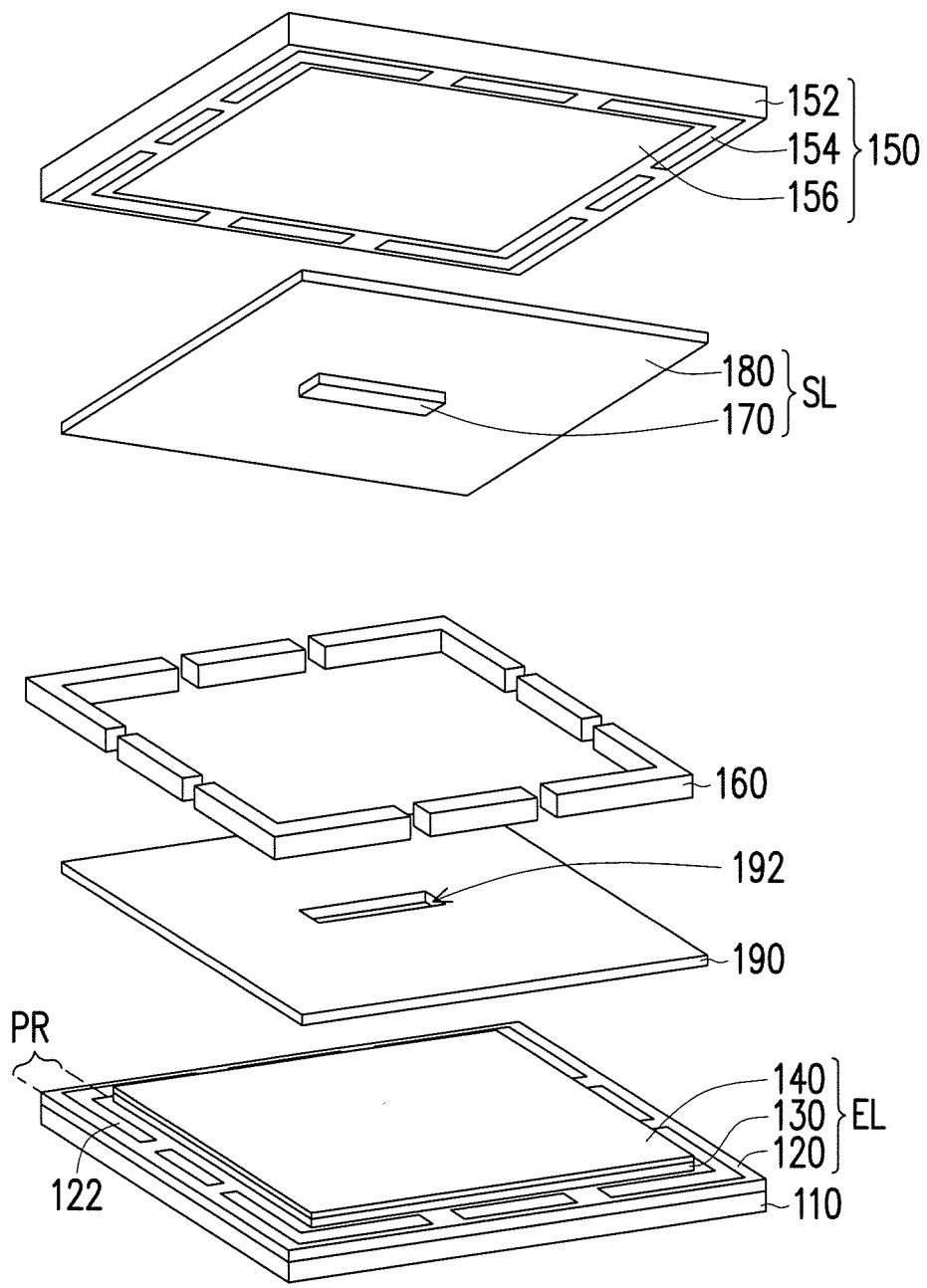
FIG. 1 is a schematic diagram of a light-emitting assembly according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
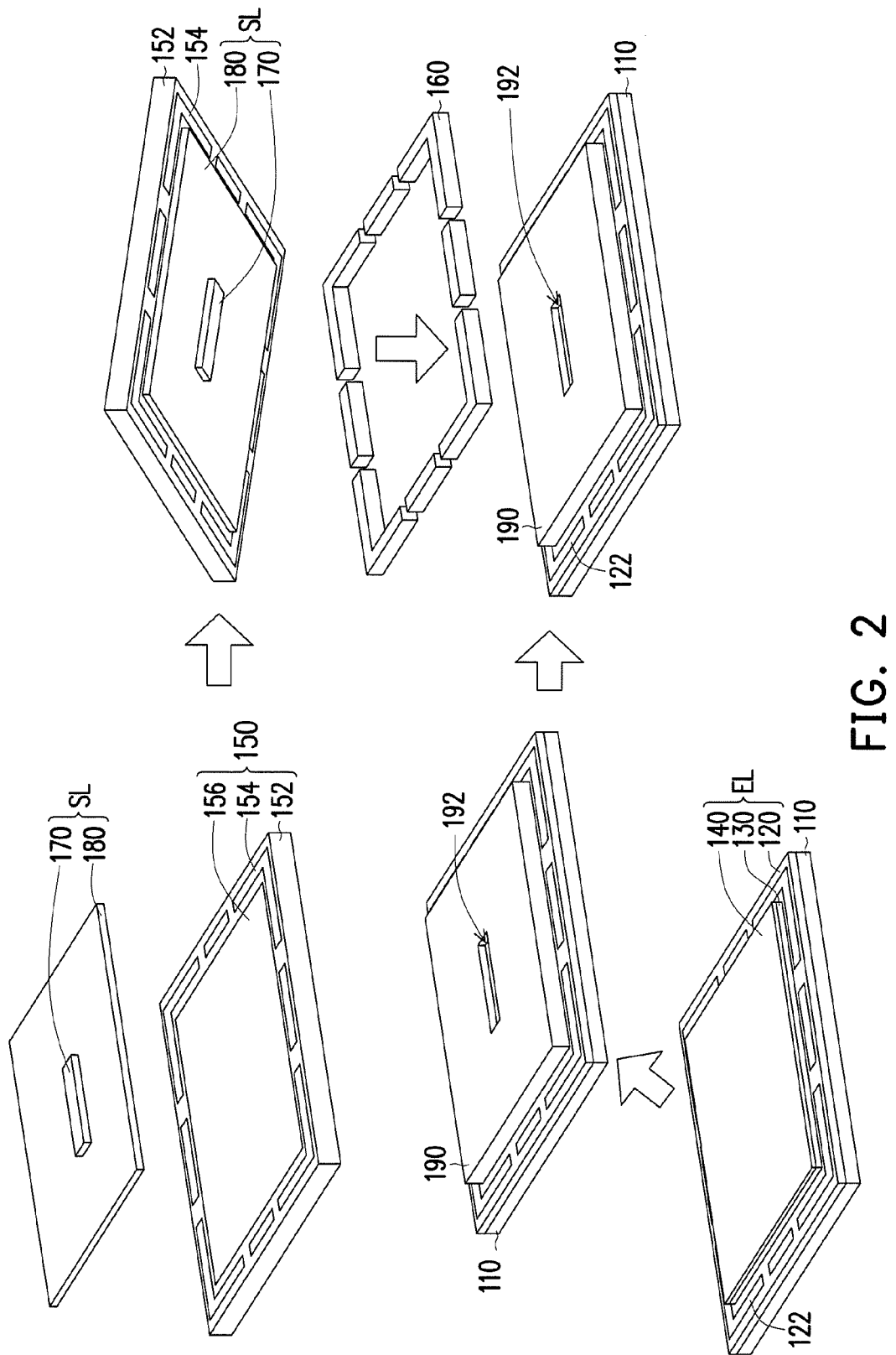
FIG. 2 is a schematic diagram of a manufacturing method of the light-emitting assembly of FIG. 1.

FIG. 1 is a schematic diagram of a light-emitting assembly according to an embodiment of the disclosure, and FIG. 2 is a schematic diagram of a manufacturing method of the light-emitting assembly of FIG. 1, where in order to clearly indicate structures of various components of the light-emitting assembly, at least a part of the components of FIG. 1 is presented in an exploded view. Referring to FIG. 1 and FIG. 2, the light-emitting assembly 100 includes a first substrate 110, a first electrode layer 120, a light-emitting layer 130, a second electrode layer 140, a second substrate 150, a first conductive member 160, a second conductive member 170, a sealing layer 180 and a moisture barrier layer 190. A method for manufacturing the light-emitting assembly 100 may include following steps. First, the first electrode layer 120, the light-emitting layer 130 and the second electrode layer 140 are sequentially disposed on the first substrate 110 to form a light-emitting structure EL.

The first electrode layer 120 and the second electrode layer 140 may be made of a conductive material, where the first electrode layer 120 may further has a light transparent property to allow a light emitted by the light-emitting layer 130 to emit out. For example, the first electrode layer 120 may be a transparent electrode layer which is constructed by at least one of transparent metal oxide, a transparent organic conductive material, a conductive grid layer having enough transparency, and a conductive layer formed by nano metal wire, where the transparent metal oxide includes indium tin oxide, indium zinc oxide, tin oxide, zinc oxide, etc. Alternatively, the first electrode layer 120 may be composed of a composite material, for example, commonly composed of a grid layer formed by conductive grids having transparency and a metal wire layer formed by nano metal wires. Besides the aforementioned materials, the second electrode layer 140 may be made of metal or metal alloy. Moreover, in order to decrease a contact impedance of the first electrode layer 120 connected to the first conductive member 160 or in order to uniform a current density of the light-emitting layer 130 in operation, a plurality of contacts 122 may be configured on the first electrode layer 120. The contacts 122 may be made of a metal material, and may be fabricated together with the second electrode layer 140 in a same fabrication step.

A material of the light-emitting layer 130 includes an organic light-emitting material or other material capable of being driven by the first electrode layer 120 and the second electrode layer 140 to emit light. In a case that the material of the light-emitting layer 130 is the organic light-emitting material, after the light-emitting structure EL is formed on the first substrate 110, the moisture barrier layer 190 may be further formed to warp the light-emitting structure EL to prevent external moisture from entering the light-emitting layer 130. The moisture barrier layer 190 may be made of oxide or nitride, for example, an inorganic material such as silicon nitride and/or silicon oxide, etc. Moreover, the moisture barrier layer 190 may be a multi-layer structure. The moisture barrier layer 190 may be selectively doped with a water absorbing or oxygen absorbing material. Moreover, an opening 192 may be formed on the moisture barrier layer 190 to expose the second electrode layer 140.

Moreover, the second substrate 150 and a composite sealing structure SL integrated with the sealing layer 180 and the second conductive member 170 are provided. The second substrate 150 is configured with a first circuit 154 and a second circuit 156, and the first circuit 154 and the second circuit 156 are exposed on a surface 150S of the second substrate 150. During the process of manufacturing the light-emitting assembly 100, the composite sealing structure SL carried by a temporary carrying substrate (not shown) may be first attached to the surface 150S of the second substrate 150, and then the temporary carrying substrate (not shown) is removed. The second conductive member 170 in the composite sealing structure SL is connected to the second circuit 156, and the sealing layer 180 does not cover the first circuit 154. Namely, the first circuit 154 is exposed by the composite sealing structure SL.

Then, the first conductive member 160 is configured between the first substrate 110 and the second substrate 150, and a lamination step is performed. Before the lamination step, the first conductive member 160 may be first disposed on the first circuit 154. In the lamination step, the surface 150S of the second substrate 150 faces the light-emitting structure EL on the first substrate 110, and the first conductive member 160 is aligned with the contacts 122 on the first electrode layer 120 and the second conductive member 170 is aligned with the opening 192 to complete the light-emitting assembly 100 of FIG. 1. Alternatively, before the lamination step, the first conductive member 160 may be first configured on the contacts 122 of the first electrode layer 120. In the lamination step, the surface 150S of the second substrate 150 faces the light-emitting structure EL on the first substrate 110, and the first conductive member 160 is aligned with the first circuit 154 and the second conductive member 170 is aligned with the opening 192 to complete the light-emitting assembly 100 of FIG. 1. Namely, the manufacturing method of the light-emitting assembly 100 only requires one lamination step, which avails simplifying the manufacturing process of the light-emitting assembly 100.

The sealing layer 180 is, for example, a photo curable material, so that a photo-curing step may be performed after the aforementioned lamination step. By irradiating a radiation ray capable of curing the sealing layer 180, the sealing layer 180 is cured. The radiation ray irradiated in the light-curing step may be selected according to a characteristic of the photo curable material. If the photo curable material is a curable material under an ultraviolet (UV) light, the light-curing step adopts the UV light. In other embodiments, besides the light-curing step, a heating step with a proper temperature may be performed under a premise of not influencing the property of the light-emitting layer 130 to cure the sealing layer 180, or cure the first conductive member 160 and the second conductive member 170. For example, the first conductive member 160 and the second conductive member 170 are solder pastes, for example, solder material such as tin, the heating step is a low temperature reflow step, and the temperature of the heating step (50° C.-150° C.) is lower than a tolerance temperature of the light-emitting layer 130.

Moreover, the first conductive member 160 and the second conductive member 170 may be conductive adhesives having an attaching property without being heated, for example, copper adhesive, silver adhesive, etc. Moreover, the conductive adhesive may take an adhesive material having an anti-water-oxygen function as a matrix, and conductive particles are doped to the matrix. In an embodiment, the matrix includes unsaturated polyester, epoxy resin, bismaleimide, polyimide, thermoplastic polymer resin, etc., or a material with a molecular structure carrying 1 or 2 epoxy groups. The matrix may be added with a hardening agent to cause a crosslinking reaction and to have a water-oxygen blocking function, where the hardening agent is, for example, aliphatic amines, polyamide, cycloaliphatic amines, aromatic amines, acid anhydrides, lewis acid, imidazoles, dicyandiamide, —$NH_2$, hyperoxide, —OH, etc. In an embodiment, the matrix may contain catalyst to decrease a hardening temperature, where the catalyst may include $BF_3$, $(CH_3)_2NH$. Further, in order to improve a mechanical property, the matrix may be added with carboxy-terminated polybutadiene acrylonitrile (CTBN) or amino-terminated polybutadiene acrylonitrile (ATBN). In order to implement water resistance and conductivity, the conductive particles include conductive polymers, for example, polyacetylene, polythiophene, polypyrrole, polyaniline, polyphenylene, etc. The conductive particles can also be one of metal particles, carbon, graphite and conductive fiber. Therefore, the first conductive member 160 and the second conductive member 170 may be disposed between the first substrate 110 and the second substrate 150 without heating or being treated by a low temperature reflow. Moreover, a sheet resistance of the conductive adhesive may be smaller than or equal to 100 ohm/square unit. Alternatively, a water vapour transmission rate (WVTR) of the conductive adhesive is smaller than or equal to $10^{-2}$ $g/m^2/day$.

Moreover, as shown in FIG. 1, it is known that in the light-emitting assembly 100, the second electrode layer 140 of the light-emitting structure EL and the second conductive member 170 to be connected to the second electrode layer 140 are all located within an area of the light-emitting layer 130. Therefore, a peripheral area outside the area of the light-emitting layer 130 is only required to provide a configuration area of the first electrode layer 120 and the first conductive member 160, which avails reducing a border width of the light-emitting assembly 100. Comparatively, if the second electrode layer 140 is extended to be outside the area of the light-emitting layer 130 to make the first electrode layer 120 and a portion of the second electrode layer 140 to be located at a same plane position of the first substrate 110, a certain space (for example, at least 3 mm in width) in the peripheral area outside the light-emitting layer 130 has to be preserved to isolate the first electrode layer 120 and a portion of the second electrode layer 140 on the same plane, so as to keep electrical independence of the two electrode layers. Now, the peripheral area outside the light-emitting layer 130 cannot be reduced so that a narrow border structure design cannot be achieved. Therefore, in the present embodiment, the composite sealing structure SL is adopted to connect the first electrode layer 120 and the second electrode layer 140 which are on different plane positions to the second substrate 150, which avails applying in narrow border products.

Figure 3:
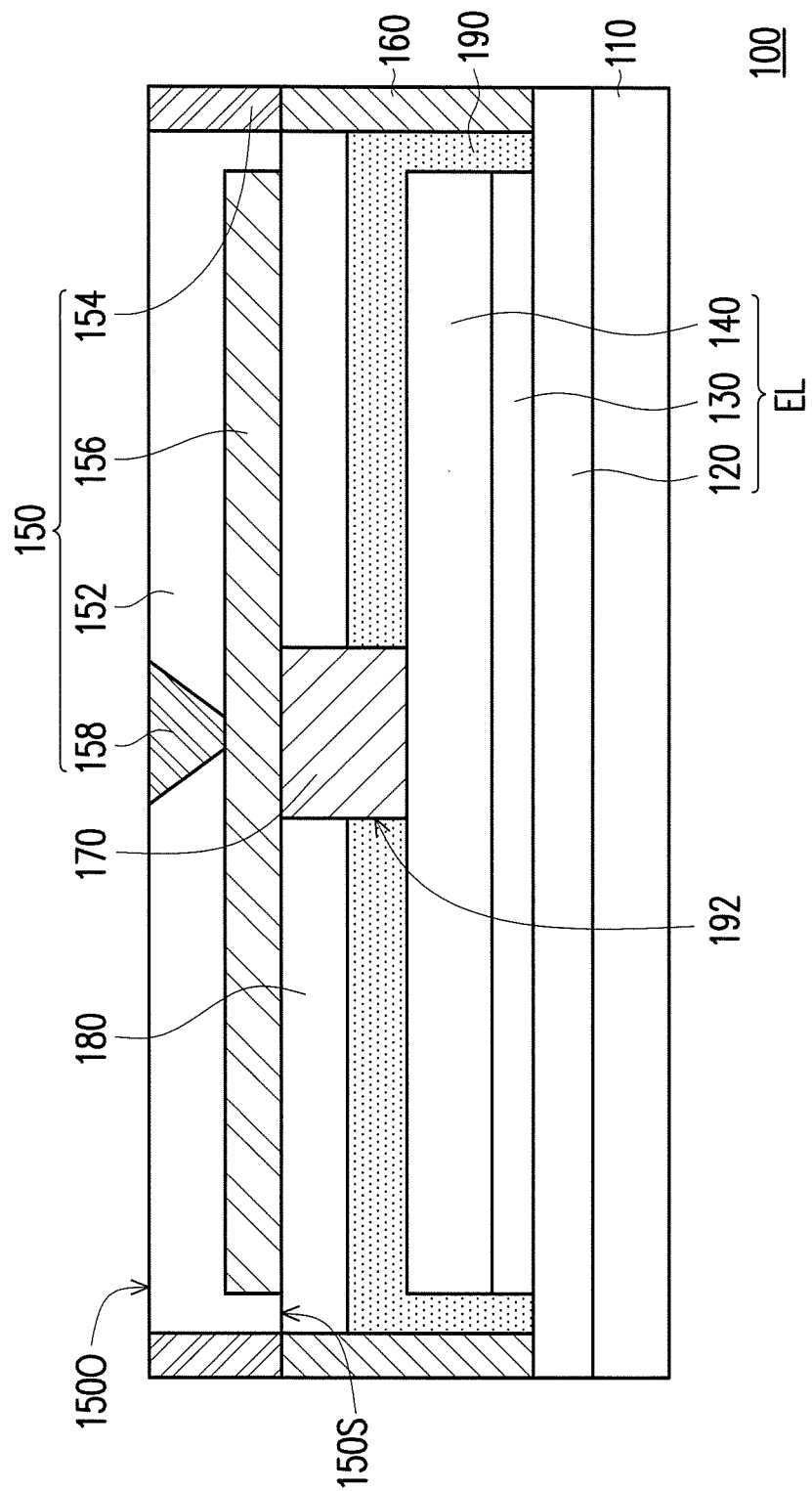
FIG. 3 is a cross-sectional view of the light-emitting assembly of FIG. 1.

FIG. 3 is a cross-sectional view of the light-emitting assembly of FIG. 1. Referring to FIG. 1 and FIG. 3, in the light-emitting assembly 100, the first electrode layer 120, the light-emitting layer 130 and the second electrode layer 140 are sequentially stacked on the first substrate 110 to construct the light-emitting structure EL. The sealing layer 180 is disposed between the light-emitting structure EL and the second substrate 150, such that the light-emitting structure EL is packaged between the first substrate 110 and the second substrate 150. The second substrate 150 includes an insulating matrix 152, the first circuit 154 and the second circuit 156 and the first circuit 154 and the second circuit 156 are disposed in the insulating matrix 152. The first electrode layer 120 is electrically connected to the first circuit 154 through the first conductive member 160, and the second electrode layer 140 is electrically connected to the second circuit 156 through the second conductive member 170. The moisture barrier layer 190 covers the light-emitting structure EL, and at least wraps the light-emitting layer 130 and the second electrode layer 140. Moreover, the second substrate 150 may be selectively disposed with a heat conducting pattern 158, and the heat conducting pattern 158 is connected to the second circuit 156, such that the heat generated during the operation of the light-emitting structure EL is led out through a heat conducting function of the heat conducting pattern 158, which avails maintaining or prolonging a service life of the light-emitting assembly 100. Moreover, the heat conducting pattern 158 may be designed to have a first area at an end contacting the second circuit 156 and have a second area at an end exposed to an outer surface 150O, where the second area is greater than the first area. Alternatively, the outline of the heat conducting pattern 158 may be designed to gradually increase a width thereof from the second circuit 156 towards the outer surface 150O.

In the light-emitting structure EL, a whole area of the second electrode layer 140 is located within the area of the light-emitting layer 130, and besides a part of an area of the first electrode layer 120 is overlapped with the area of the light-emitting layer 130, the other part of the area of the first electrode layer 120 extends outward from the area of the light-emitting layer 130 to define a peripheral region PR. In order to implement electrical connection between the components, the second conductive member 170 is located within the area of the second electrode layer 140, and the first conductive member 160 is located in the peripheral region PR. Therefore, the first conductive member 160 is disposed at periphery of the light-emitting structure EL and surrounds the second conductive member 170. The second conductive member 170 is disposed in the sealing layer 180 and penetrates through the sealing layer 180. Moreover, the moisture barrier layer 190 is located between the sealing layer 180 and the second electrode layer 140, and the second conductive member 170 also penetrates through the moisture barrier layer 190 to connect the second electrode layer 140. Therefore, the moisture barrier layer 190 has an opening 192 accommodating the second conductive member 170.

In the present embodiment, the second substrate 150 may be regarded as a circuit board, and one or multiple layers of conductive layers may be configured in the insulating matrix 152, and different conductive layers may be patterned according to different designs to implement required conducting paths. In other words, the second substrate 150 may be a laminated circuit board, a printed circuit board, a flexible circuit board, etc. For example, the first circuit 154 and the second circuit 156 exposed on a surface 150S of the second substrate 150 may be formed by patterning a same conductive layer in the second substrate 150, and the first circuit 154 and the second circuit 156 are not physically connected in the second substrate 150, such that the first circuit 154 and the second circuit 156 may provide two independent electrical conduction paths. Moreover, the heat conducting pattern 158 may be formed by another conductive layer in the second substrate 150. In this way, the heat conducting pattern 158 may extend along a thickness direction to expose at the outer surface 150O of the second substrate 150. In an embodiment, the outer surface 150O of the second substrate 150 may be attached with a heat dissipation layer (not shown) to improve a heat dissipation efficiency of the heat conducting pattern 158.

Figure 4:
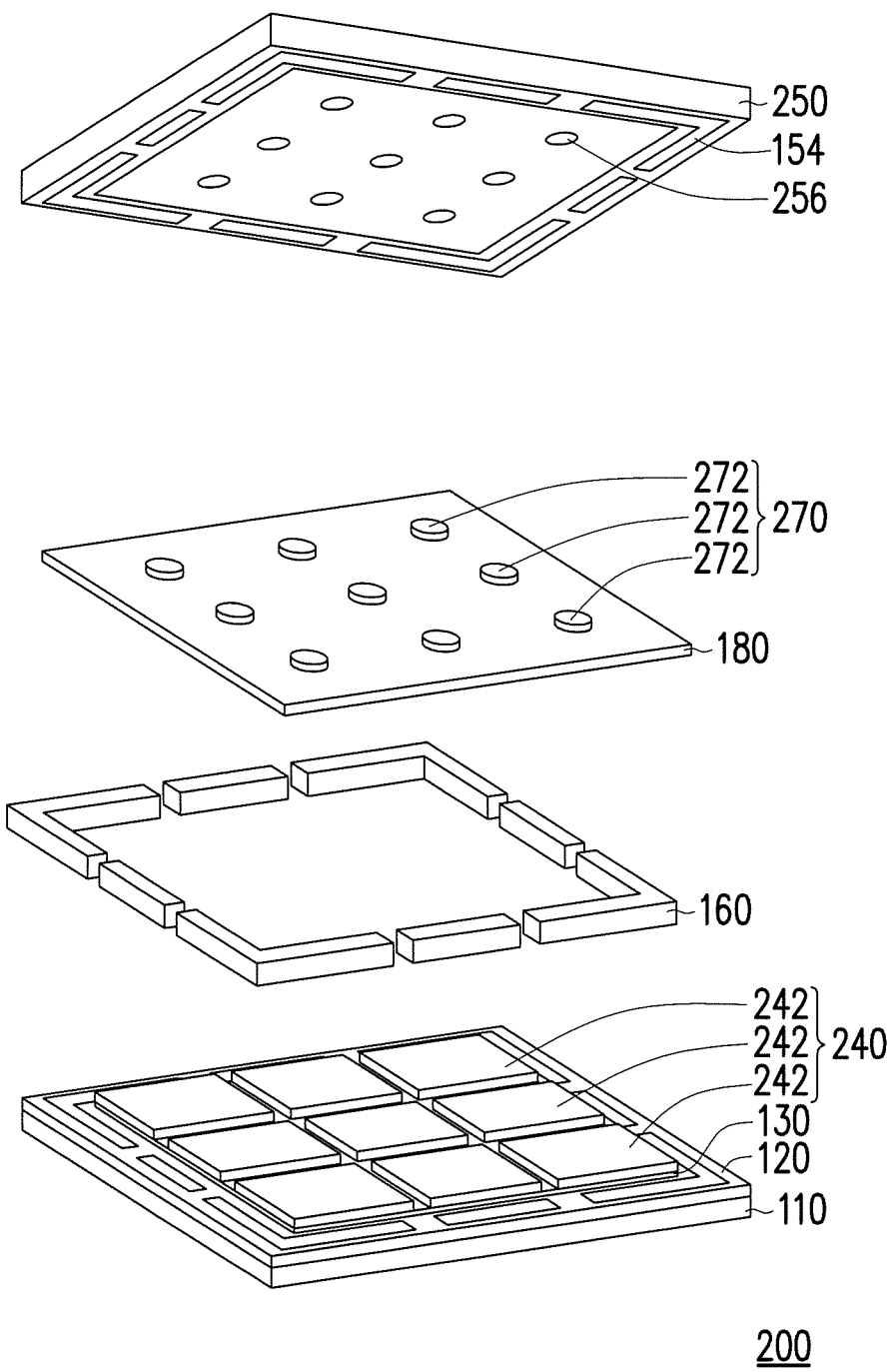
FIG. 4 is a schematic diagram of a light-emitting assembly according to another embodiment of the disclosure.
Figure 5:
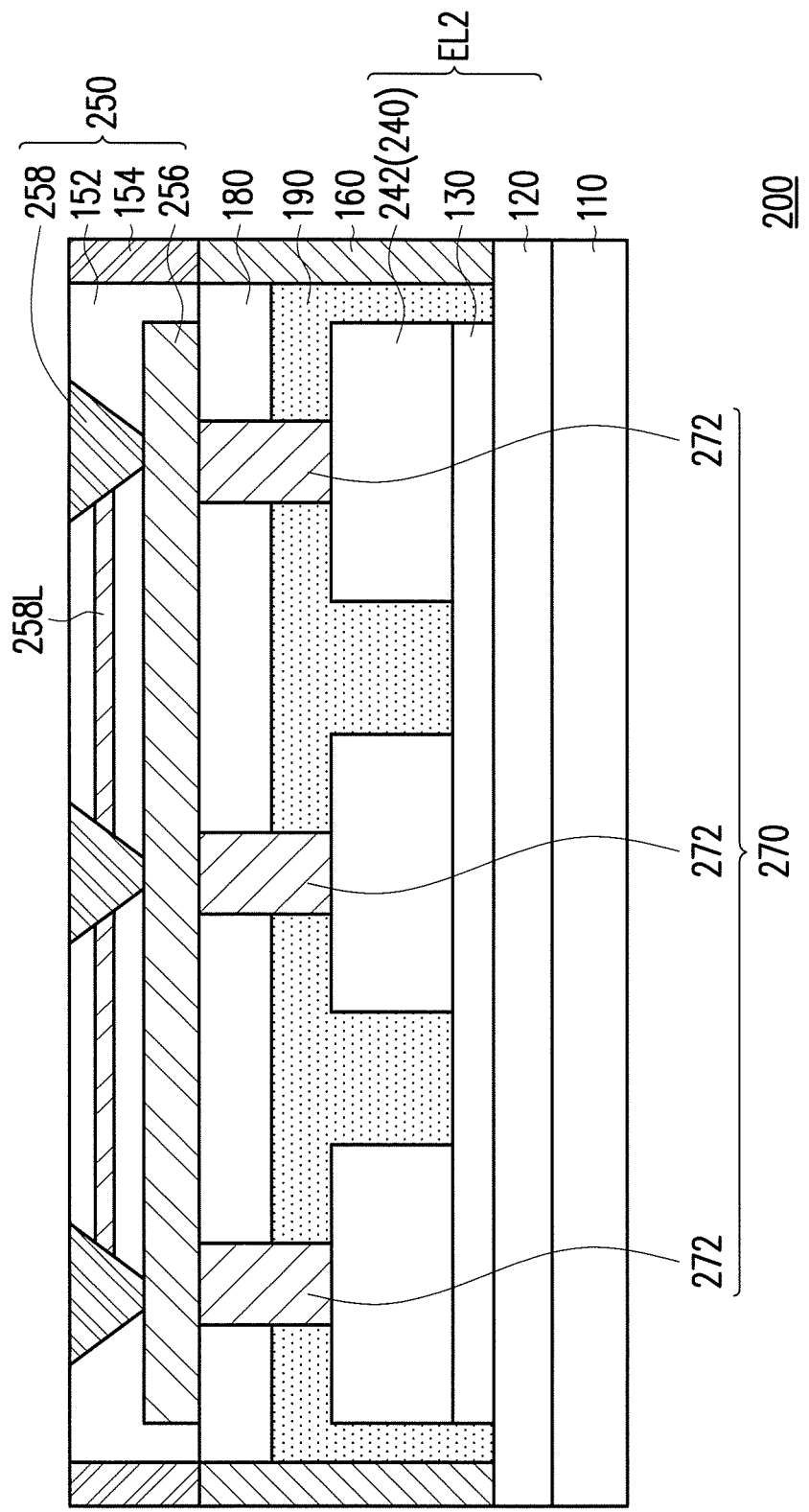
FIG. 5 is a cross-sectional view of the light-emitting assembly of FIG. 4.

FIG. 4 is a schematic diagram of a light-emitting assembly according to another embodiment of the invention, in which in order to clearly present structures of various components of the light-emitting assembly, at least a part of the components of FIG. 4 is presented in an exploded view. Moreover, FIG. 5 is a cross-sectional view of the light-emitting assembly of FIG. 4. Referring to FIG. 4 and FIG. 5, the light-emitting assembly 200 includes the first substrate 110, the first electrode layer 120, the light-emitting layer 130, a second electrode layer 240, a second substrate 250, the first conductive member 160, a second conductive member 270, the sealing layer 180 and the moisture barrier layer 190. In the present embodiment, the first substrate 110, the first electrode layer 120, the light-emitting layer 130, the first conductive member 160, the sealing layer 180 and the moisture barrier layer 190 are similar to the embodiment of FIG. 1 to FIG. 3, so that configuration relationship between the components may refer to the aforementioned embodiment, and description thereof is not repeated. Moreover, in the present embodiment, the insulating matrix 152 and the first circuit 154 in the second substrate 250 are similar to the aforementioned embodiment, and detail thereof is not repeated.

Figure 6:
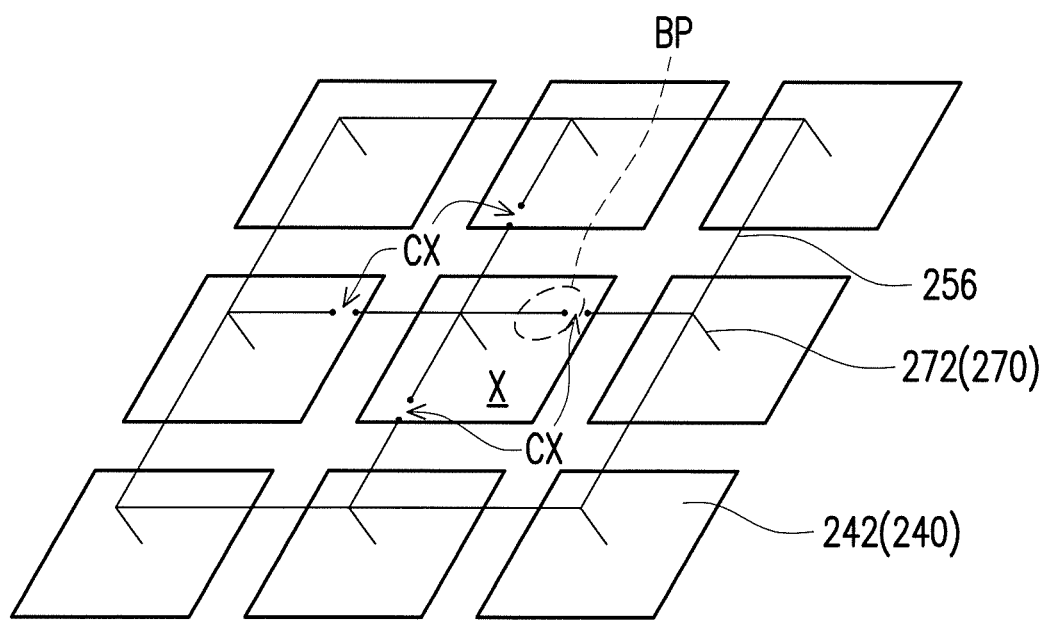
FIG. 6 is a schematic diagram of a second electrode layer, a second conductive member 270 and a second circuit 256 according to an embodiment of the disclosure.

To be specific, the first electrode layer 120, the light-emitting layer 130 and the second electrode layer 240 are sequentially stacked on the first substrate 110 to construct the light-emitting structure EL2, where the second electrode layer 240 is patterned to include a plurality of electrode patterns 242. The electrode patterns 242 are independent to each other in contours, such that each of the electrode patterns 242 independently controls the light-emitting effect of the light-emitting layer 130 in a specific area. Meanwhile, the second conductive member 270 of the light-emitting assembly 200 includes a plurality of conductive patterns 272, where each of the conductive patterns 272 is configured to conduct one of the electrode patterns 242 to the second circuit 256 of the second substrate 250 and the conductive patterns 272 may be electrically connected to each other through a structure of the second circuit 256. In an embodiment, referring to FIG. 6, FIG. 6 is a schematic diagram of the second electrode layer 240, the second conductive member 270 and the second circuit 256 according to an embodiment of the disclosure. The second circuit 256 may be designed as a mesh circuit. During the operation of the light-emitting assembly 200, if a bright point BP is generated due to excessive current concentration, the electrode pattern 242 (i.e. the electrode pattern 242 indicated as X) corresponding to the position of the bright point BP may be determined, and subsequently, the circuit corresponding to the electrode pattern 242 in the second circuit 256 may be processed to be opened (i.e. to form breakpoints CX). In this way, the electrode pattern 242 (i.e. the electrode pattern 242 indicated as X) corresponding to the bright point BP no longer generates current to avoid the over large current at the bright point BP to cause damage of the light-emitting layer 130 or failure of the light-emitting assembly 200.

Moreover, as shown in FIG. 5, it is known that the heat conducting patterns 258 formed in the second substrate 150 may respectively correspond to the electrode patterns 242. For example, an area of each of the heat conducting patterns 258 vertically projected to the first substrate 110 may be overlapped to an area of one of the electrode patterns 242 vertically projected to the first substrate 110. In this way, the heat taken by each of the electrode patterns 242 may be respectively conducted out through the corresponding heat conducting pattern 258 to achieve an ideal heat dissipation effect. Moreover, in the second substrate 250, a heat conducting layer 258L may be set to connect the heat conducting patterns 258, so as to achieve a more efficient heat conducting effect.

Figure 7:
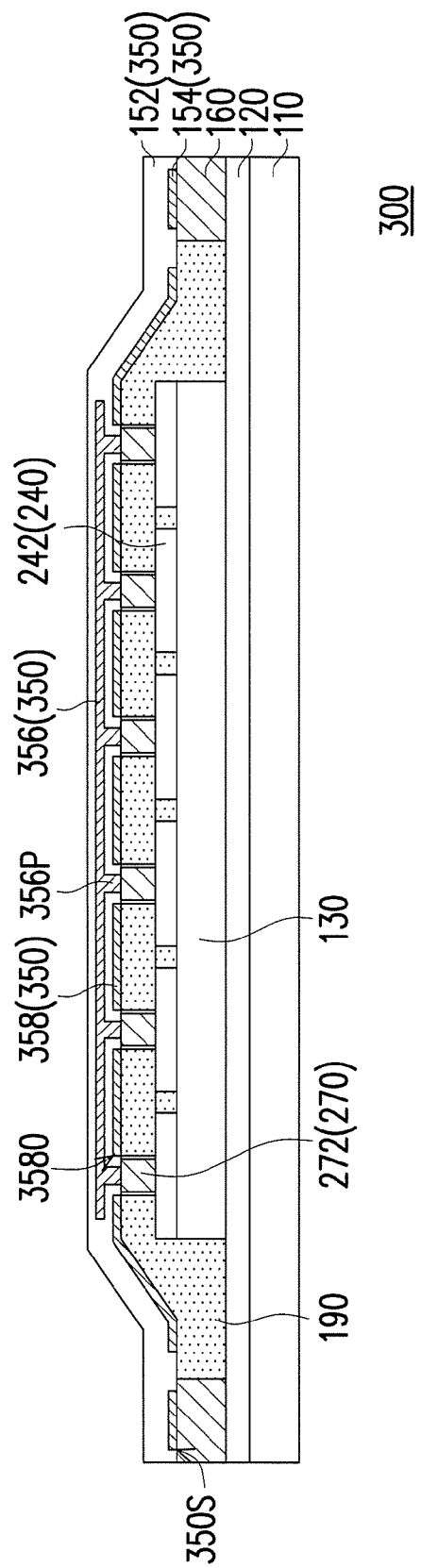
FIG. 7 is a cross-sectional view of a light-emitting assembly according to still another embodiment of the disclosure.

FIG. 7 is a cross-sectional view of a light-emitting assembly according to still another embodiment of the disclosure. Referring to FIG. 7, the light-emitting assembly 300 includes the first substrate 110, the first electrode layer 120, the light-emitting layer 130, the second electrode layer 240, a second substrate 350, the first conductive member 160, the second conductive member 270 and the moisture barrier layer 190, where configuration positions, structures and properties of the first substrate 110, the first electrode layer 120, the light-emitting layer 130, the second electrode layer 240, the first conductive member 160, the second conductive member 270 and the moisture barrier layer 190 may refer to the aforementioned embodiment, and details thereof are not repeated.

In the present embodiment, the second substrate 350 includes the insulating matrix 152, the first circuit 154, a second circuit 356 and a barrier metal layer 358, and configuration positions, structures and properties of the insulating matrix 152 an the first circuit 154 may refer to the aforementioned embodiment. The first circuit 154 and the barrier metal layer 358 may be formed by a same conductive layer in the second substrate 350, and the second circuit 356 is formed by another conductive layer in the second substrate 350. According to FIG. 7, it is known that the conductive layer constructing the first circuit 154 and the barrier metal layer 358 is located between the conductive layer constructing the second circuit 356 and the second conductive member 270. Namely, the barrier metal layer 358 is located between the second circuit 356 and the second electrode layer 240.

The barrier metal layer 358 is exposed at a surface 350S of the second substrate 350 to contact the sealing layer 180. Moreover, an area of the barrier metal layer 358 covers the area of the light-emitting layer 130. Moreover, in order to provide the electrical connection between the second circuit 356 and the second electrode layer 240, the barrier metal layer 350 has an opening 358O corresponding to the second conductive member 370. Meanwhile, the second circuit 356 has a protrusion portion 356P extending to the opening 358O, such that the second conductive member 270 is electrically connected to the protrusion portion 356P in the opening 358O, and the barrier metal layer 358 is electrically isolated to the second circuit 356 and is electrically isolated to the second conductive member 270.

The barrier metal layer 358 is made of a metal material, so that the barrier metal layer 358 may prevent moisture from invading to the internal of the light-emitting assembly 300, which avails decreasing a chance that the light-emitting layer 130 is damaged due to the invaded moisture. In other words, the barrier metal layer 358 may serve as a moisture blocking structure of the light-emitting assembly 300. Moreover, since the barrier metal layer 358 is electrically isolated to the second circuit 356 and the second conductive member 270, the second circuit 356 and the second conductive member 270 may maintain the existed electrical connection relationship. For example, the second circuit 356 may be a mesh circuit similar to the second circuit 256 of the aforementioned embodiment, and provide a repairing function when the bright point occurs. Further, the barrier metal layer 358 may be connected to a ground potential.

Figure 8:
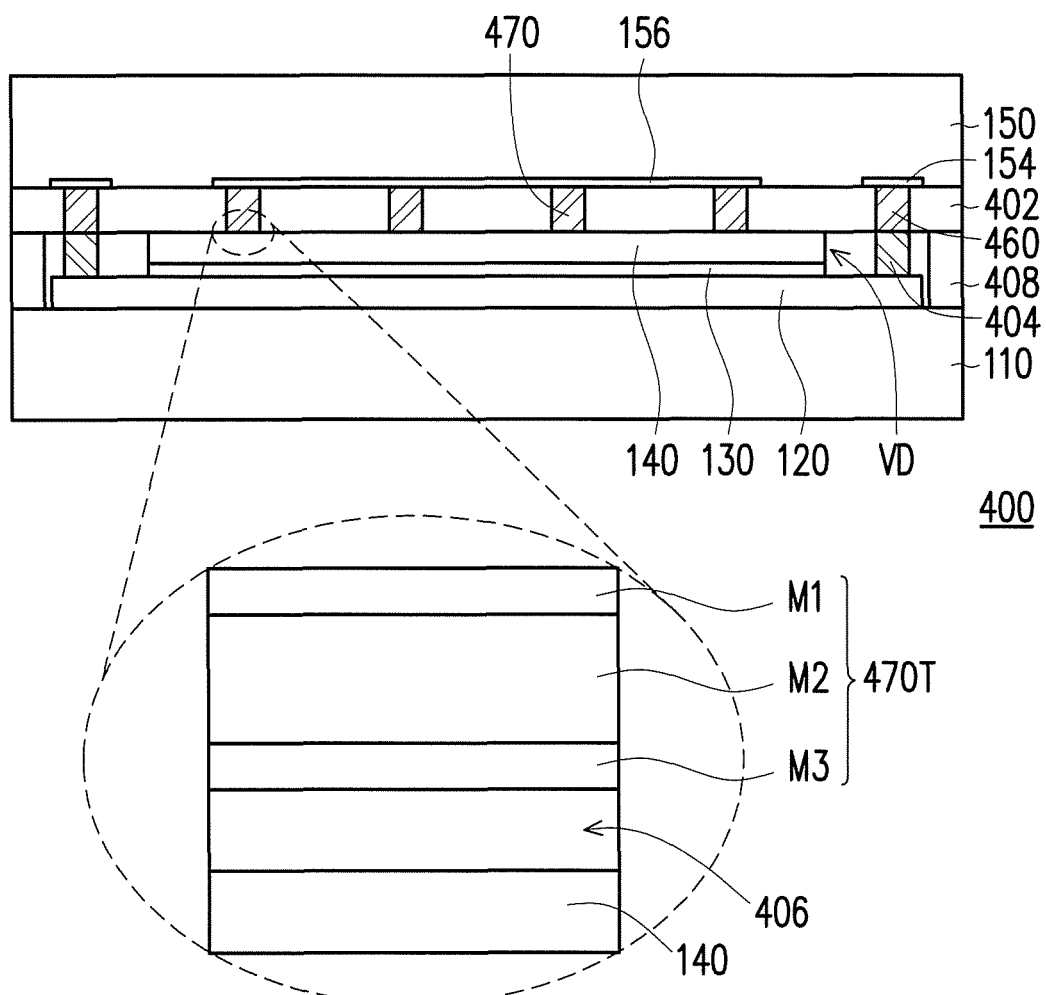
FIG. 8 is a cross-sectional view of a light-emitting assembly according to an embodiment of the disclosure.

FIG. 8 is a cross-sectional view of a light-emitting assembly according to an embodiment of the disclosure. Referring to FIG. 8, the light-emitting assembly 400 includes the first substrate 110, the first electrode layer 120, the light-emitting layer 130, the second electrode layer 140, the second substrate 150, a third substrate 402, a first conductive member 460 and a second conductive member 470. The first electrode layer 120, the light-emitting layer 130 and the second electrode layer 140 are sequentially disposed on the first substrate 110. A whole area of the second electrode layer 140 is located within the area of the light-emitting layer 130. The second substrate 150 has the first circuit 154 and the second circuit 156. The second electrode layer 140 is located between the second substrate 150 and the light-emitting layer 130. The third substrate 402 is located between the second substrate 150 and the second electrode layer 140. The first conductive member 460 and the second conductive member 470 all penetrate through the third substrate 402 and are disposed between the first substrate 110 and the second substrate 150. The first electrode layer 120 is electrically connected to the first circuit 154 on the second substrate 150 through the first conductive member 460. The second conductive member 470 electrically connects the second electrode layer 140 to the second circuit 156 on the second substrate 150, where the second conductive members 470 is located within the area of the second electrode layer 140. In the present embodiment, the first substrate 110, the first electrode layer 120, the light-emitting layer 130, the second electrode layer 140 and the second substrate 150 all adopt the referential numbers used in the aforementioned embodiments, so that the configuration relationships, structures and properties of the components may refer to the aforementioned embodiments, and description thereof is not repeated. Moreover, the second electrode layer 140 of the present embodiment may adopt the second electrode layer 240 of the aforementioned embodiment, and the second substrate 150 may adopt the second substrate 250 or the second substrate 350 of the aforementioned embodiment.

In the present embodiment, the light-emitting assembly 400 further includes a first conductive bonding member 404 and a second conductive bonding member 406, where the first conductive bonding member 404 is disposed between the first conductive member 460 and the first electrode layer 120, and the second conductive bonding member 206 is disposed between the second conductive member 470 and the second electrode layer 140. Moreover, a void VD exists between the first conductive bonding member 404 and the light-emitting layer 130. Namely, the light-emitting assembly 400 adopts a void packaging method, by which the sealing layer is omitted to simplify the structure design and simplify the manufacturing method thereof. Moreover, the light-emitting assembly 400 may further include a bonding frame adhesive 408 to bond the first substrate 110 to the second substrate 150 and the third substrate 402 already attached together, where the bonding frame adhesive 408 encircles a periphery of the light-emitting assembly 400.

In an embodiment, the third substrate 402 may be a glass substrate or a thin glass substrate with a thickness smaller than 0.5 mm or even smaller than 0.1 mm. When the light-emitting assembly 400 is manufactured, the second substrate 150 and the third substrate 402 may be first adhered together, and then the third substrate 402 is adhered on the second electrode layer 140. Therefore, the third substrate 402 may directly contact the second electrode layer 140. In an embodiment, the first conductive bonding member 404 and the second conductive bonding member 406 respectively include a conductive adhesive or a solder paste. Moreover, in order to implement the electrical connection between the conductive bonding members, the first conductive member 460 and the second conductive member 470 respectively have a contact terminal, and material and lamination of the contact terminal may be adjusted to improve a bonding feature.

For example, the second conductive member 470 has a contact terminal 470T, and the contact terminal 470T refers to an end of the second conductive member 470 proximate to the second electrode layer 140. The contact terminal 470T includes a first material layer M1, a second material layer M2 and a third material layer M3 sequentially stacked from the second substrate 150 towards the second electrode layer 140, where a material of the first material layer M1 includes titanium, a material of the second material layer M2 includes copper, and a material of the third material layer M3 includes a tin silver alloy. Moreover, a whole resistance of the contact terminal 470T may be 18 ohm/square unit to 30 ohm/square unit. A thickness of the first material layer M1 may be 50 nm to 100 nm, a thickness of the second material layer M2 may be 100 nm to 500 nm, and a thickness of the third material layer M3 may be 1 μm to 100 μm. Moreover, a manufacturing method of the first material layer M1, the second material layer M2 and the third material layer M3 may be physical vapour deposition (PVD), electrochemical plating (ECP) or other methods capable of depositing metal in narrow pores of the glass substrate.

In the aforementioned embodiments, the light-emitting assemblies 100-400 may be applied in a lighting field to provide a large lighting area. The structure designs of the light-emitting assemblies 100-400 respectively including one light-emitting structure are taken as examples for description, though in other embodiments, a single light-emitting assembly may include a plurality of light-emitting structures. In a case that a single light-emitting assembly includes a plurality of light-emitting structures, light emitted by different light-emitting structures may selectively have different wavelength ranges. Therefore, the structures of the aforementioned embodiments are only examples, and are not used for limiting a scope of the disclosure. Moreover, the values mentioned in the aforementioned embodiment are only examples.

Figure 9A:
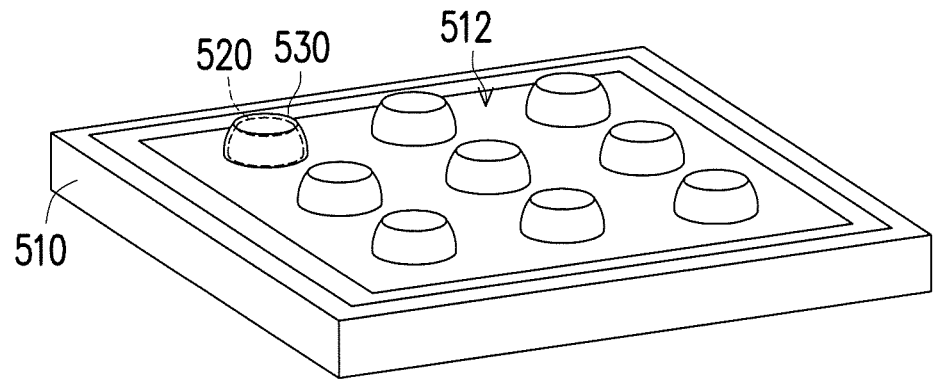
FIG. 9A to FIG. 9C are diagrams illustrating a method for manufacturing a composite sealing structure according to an embodiment of the disclosure.
Figure 9B:
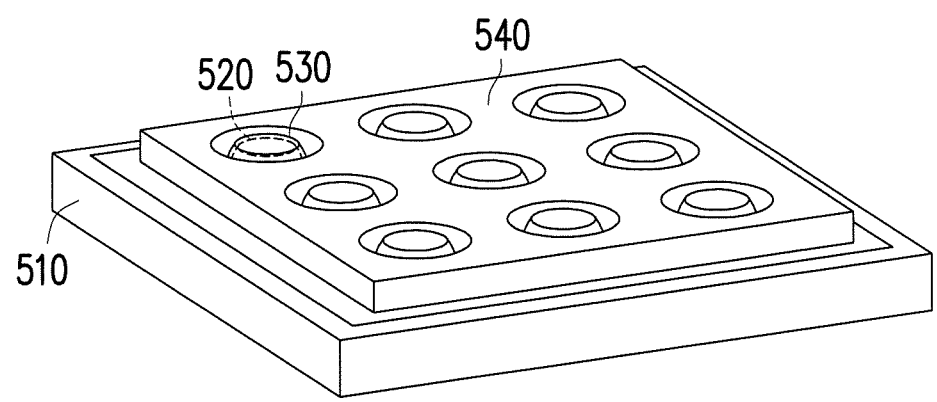
Figure 9C:
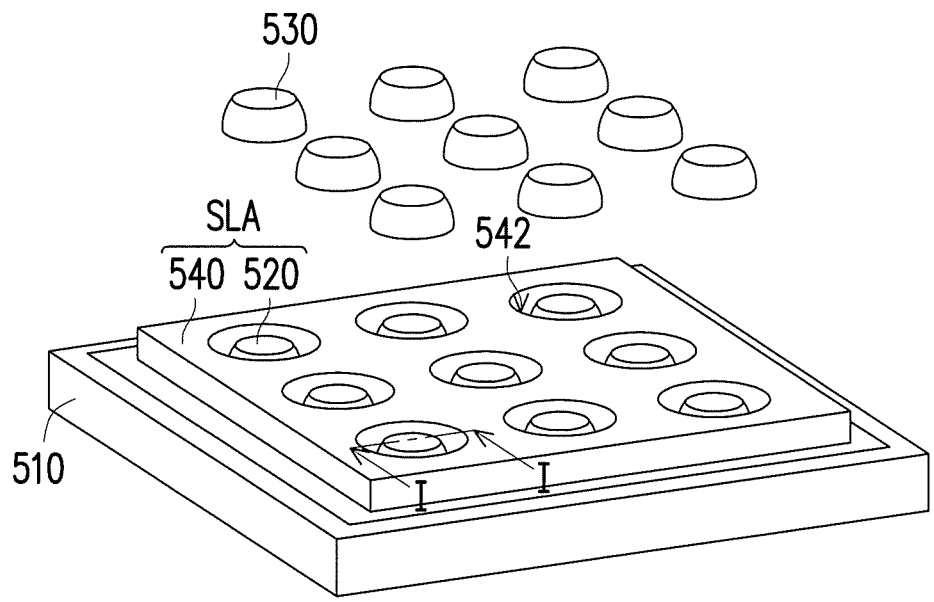

FIG. 9A to FIG. 9C are diagrams illustrating a method for manufacturing a composite sealing structure according to an embodiment of the disclosure. Referring to FIG. 9A, a plurality of conductive adhesive patterns 520 is fabricated on a substrate 510. The substrate 510 may be a circuit board, the substrate 510 has a plurality of contacts (not shown) to be electrically conducted to external assemblies, and the conductive adhesive patterns 520 are disposed corresponding to the contacts. The conductive adhesive patterns 520 are independent to each other in structure, and are not directly contacted to provide independent electrical conduction paths. Moreover, the substrate 510 may be further configured with a plurality of release film patterns 530, where each of the release film patterns 530 wraps one of the conductive adhesive patterns 520, and the release film patterns 530 are independent to each other without physical connection. In this way, the substrate 510 has an exposed area 512 not covered by the conductive adhesive patterns 520 and the release film patterns 530.

In the present embodiment, the conductive adhesive patterns 520 may be copper adhesive, silver adhesive, etc. Moreover, the conductive adhesive patterns 520 may use an adhesive material having an anti water-oxygen function as a matrix, and conductive particles are doped in the matrix. In an embodiment, the matrix includes unsaturated polyester, epoxy resin, bismaleimide, polyimide, thermoplastic polymer resin, etc., or a material with a molecular structure carrying 1 or 2 epoxy groups. The matrix may be added with a hardening agent to cause a crosslinking reaction and to have a water-oxygen blocking function, where the hardening agent is, for example, aliphatic amines, polyamide, cycloaliphatic amines, aromatic amines, acid anhydrides, lewis acid, imidazoles, dicyandiamide, —$NH_2$, hyperoxide, —OH, etc. In an embodiment, the matrix may contain catalyst to decrease a hardening temperature, where the catalyst may include $BF_3$, $(CH_3)_2NH$. Further, in order to improve a mechanical property, the matrix may be added with carboxy-terminated polybutadiene acrylonitrile (CTBN) or amino-terminated polybutadiene acrylonitrile (ATBN). In order to implement water resistance and conductivity, the conductive particles include conductive polymers, for example, polyacetylene, polythiophene, polypyrrole, polyaniline, polyphenylene, etc. The conductive particles can also be one of metal particles, carbon, graphite and conductive fiber.

Regarding a method for fabricating the conductive adhesive patterns 520 on the substrate 510, the conductive adhesives having a required contour are adhered onto predetermined positions (for example, the contacts that are not illustrated) of the substrate 510 through adhering or printing. Therefore, the conductive adhesive patterns 520 may provide an electrical conduction function at the predetermined positions of the substrate 510. When the substrate 510 is a circuit board, and the conductive adhesive patterns 520 are disposed on the contacts of the circuit board, the conductive adhesive patterns 520 may serve as media of the circuit board for electrically connecting external assemblies.

Then, referring to FIG. 9B, a sealing layer 540 is formed on the substrate 510 formed with the conductive adhesive patterns 520 and the release film patterns 530. Since the conductive adhesive patterns 520 and the release film patterns 530 do not cover the whole area of the substrate 510, the sealing layer 540 may at least contact the exposed area 512 of FIG. 9A. In the present embodiment, a method for forming the sealing layer 540 includes coating a sealing material on the substrate 510. The step of coating the sealing material may be performed to cover and wrap the entire conductive adhesive patterns 520 and the release film patterns 530, so that a coating thickness of the sealing material needs to allow exposure of the release film patterns 530. A material of the sealing layer 540 may be a curable material with a moisture blocking effect. Regarding the curable nature, the material of the sealing layer 540 may be at least one of a photo curable material, a heat curable material, a photo-heat curable material and a pressure curable material. In an embodiment, the material of the sealing layer 540 may include a resin material and a hygroscopic material. The resin material includes epoxy resin, acrylic resin, polyurethane resin, or other resin materials. The hygroscopic material includes superabsorbent polymer, inorganic compound, porous material, etc. The superabsorbent polymer is, for example, sodium polyacrylate, sodium acrylonitrile, polyacrylamide, etc. The inorganic compound includes calcium oxide, barium oxide, strontium oxide, etc. The porous material, for example, includes zeolite or ceramic material.

Then, in FIG. 9C, the release film patterns 530 are removed from the substrate 510 to expose the conductive adhesive patterns 520, so as to form the composite sealing structure SLA on the substrate 510. When the step of FIG. 9B is performed, if a part of the sealing material is accumulated on the release film patterns 530, removal of the release film patterns 530 may also result in removal of this part of the sealing material to expose the conductive adhesive patterns 520.

Figure 9D:
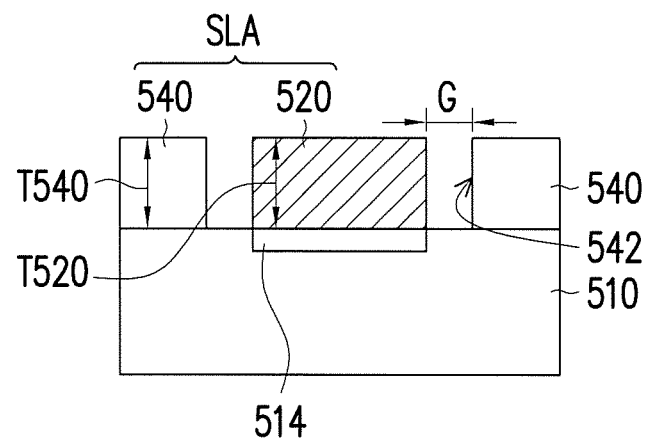
FIG. 9D is a cross-sectional view of FIG. 9C along a section line I-I.

FIG. 9D is a cross-sectional view of FIG. 9C along a section line I-I. Referring to FIG. 9C and FIG. 9D, after the release film patterns 530 are moved, the sealing layer 540 has a plurality of openings 542, and each of the conductive adhesive patterns 520 is located in one of the openings 542. Meanwhile, due to removal of the release film patterns 530, a gap G is formed between each of the conductive adhesive patterns 520 and the sealing layer 540. Namely, an area of each of the conductive adhesive patterns 520 is smaller than an area of the corresponding opening 542. Moreover, in the composite sealing structure SLA, a thickness T520 of the conductive adhesive pattern 520 is substantially the same or similar to a thickness T540 of the sealing layer 540.

Figure 10A:
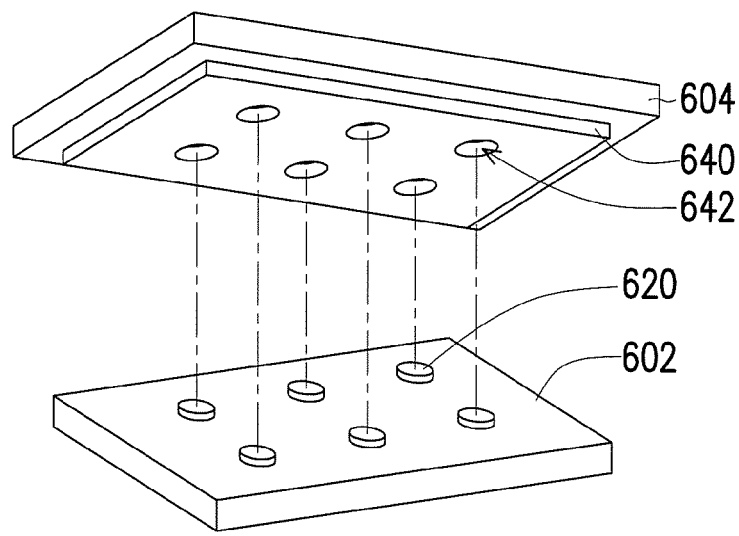
FIG. 10A to FIG. 10E are schematic diagram illustrating a method for manufacturing a composite sealing structure according to another embodiment of the disclosure.

According to FIG. 9D, it is known that the substrate 510 may be configured with contacts 514. Each of the conductive adhesive patterns 520 is correspondingly disposed on the contact 514 of the substrate 510. Since the conductive adhesive patterns 520 correspondingly connected to the contacts 514 are exposed, when the substrate 510 is bonded to another assembly through the composite sealing structure SLA, the conductive adhesive patterns 520 may serve as media for electrically connecting the substrate 510 to the other assembly. Therefore, the composite sealing structure SLA may be applied to the light-emitting assembly 100 of FIG. 1 and FIG. 3 to replace the composite sealing structure SL, and the substrate 510 in FIG. 9C and FIG. 9D may be regarded as the second substrate 150 of FIG. 1. Meanwhile, the moisture blocking feature of the sealing layer 540 may provide a sealing property that is the same as that of the sealing layer 180 to prevent deterioration or service life reduction of the light-emitting layer 130 caused by moisture invasion. Moreover, the composite sealing structure SLA may be applied in the light-emitting assembly 200 of FIG. 4, where the conductive adhesive patterns 520 of FIG. 9C and FIG. 9D replace the second conductive member 270 of FIG. 4, and the sealing layer 540 of FIG. 9C and FIG. 9D replaces the sealing layer 180 of FIG. 4. In this way, the composite sealing structure SLA may provide an electrical conduction function and a moisture barrier function in the light-emitting assembly 200 of FIG. 4. FIG. 10A to FIG. 10E are schematic diagram illustrating a method for manufacturing a composite sealing structure according to another embodiment of the disclosure. Referring to FIG. 10A, a plurality of conductive adhesive patterns 620 is fabricated on a first temporary carrier substrate 602, and a sealing layer 640 is fabricated on a second temporary carrier substrate 604. In the present embodiment, the conductive adhesive patterns 620 and the sealing layer 640 may be respectively fabricated on the first temporary carrier substrate 602 and the second temporary carrier substrate 604. The conductive adhesive patterns 620 are independent to each other, and may be fabricated on the first temporary carrier substrate 602 through printing or adhering. In an embodiment, the conductive adhesive patterns 620 of the present embodiment and the conductive adhesive patterns 520 of FIG. 9A may be fabricated by adopting a same method and a same material.

The sealing layer 640 has a plurality of openings 642, and may be fabricated on the second temporary carrier substrate 604 through printing or adhering. In the present embodiment, the sealing layer 640 may be composed of an adhesive material (for example, a double-sided adhesive) already having a solid state, and positions and sizes of the openings 642 may be set corresponding to the conductive adhesive patterns 620.

Figure 10B:
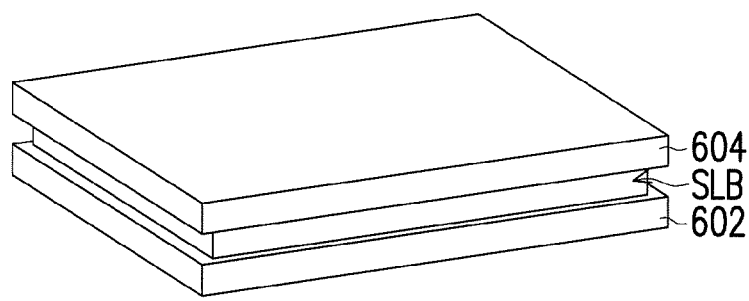

Then, referring to FIG. 10B, the first temporary carrier substrate 602 and the second temporary carrier substrate 604 are assembled to sandwich the conductive adhesive patterns 620 and the sealing layer 640 between the first temporary carrier substrate 602 and the second temporary carrier substrate 604. An assembling process includes respectively disposing the conductive adhesive patterns 620 in the openings 642 of the sealing layers 640. In this way, the conductive adhesive patterns 620 and the sealing layer 640 sandwiched between the first temporary carrier substrate 602 and the second temporary carrier substrate 604 may construct the composite sealing structure SLB.

Figure 10C:
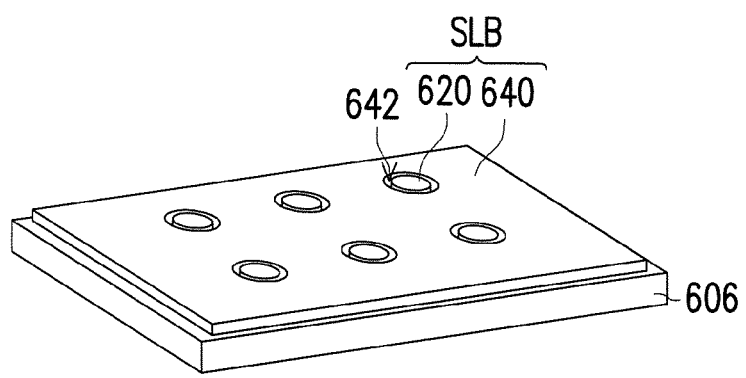

Thereafter, one of the first temporary carrier substrate 602 and the second temporary carrier substrate 604 is removed to form the composite sealing structure SLB on the remained temporary carrier substrate 606 in FIG. 10C. According to FIG. 10C, it is known that the conductive adhesive patterns 620 are respectively located in the openings 642 of the sealing layer 640, and the conductive adhesive patterns 620 are separated from each other without physical contact.

Figure 10D:
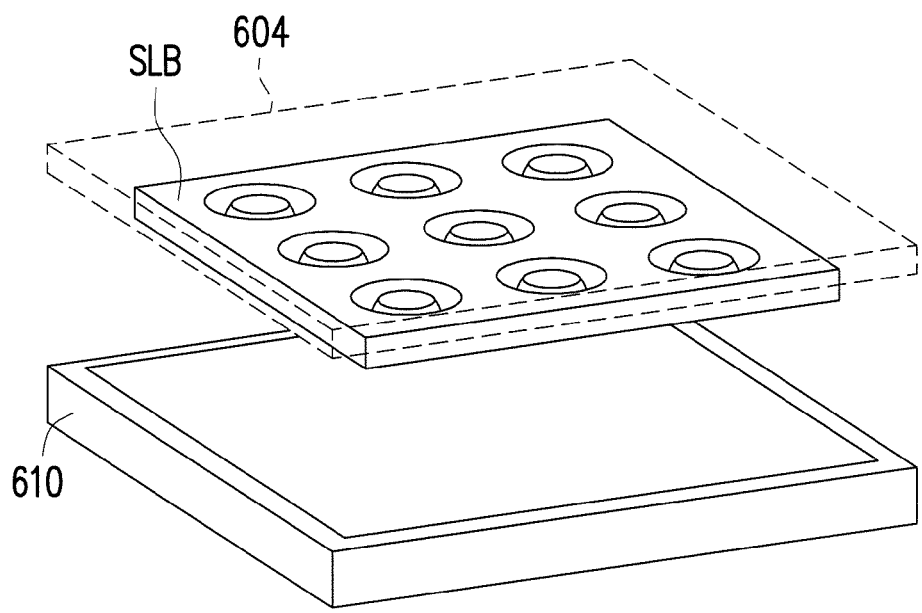
Figure 10E:
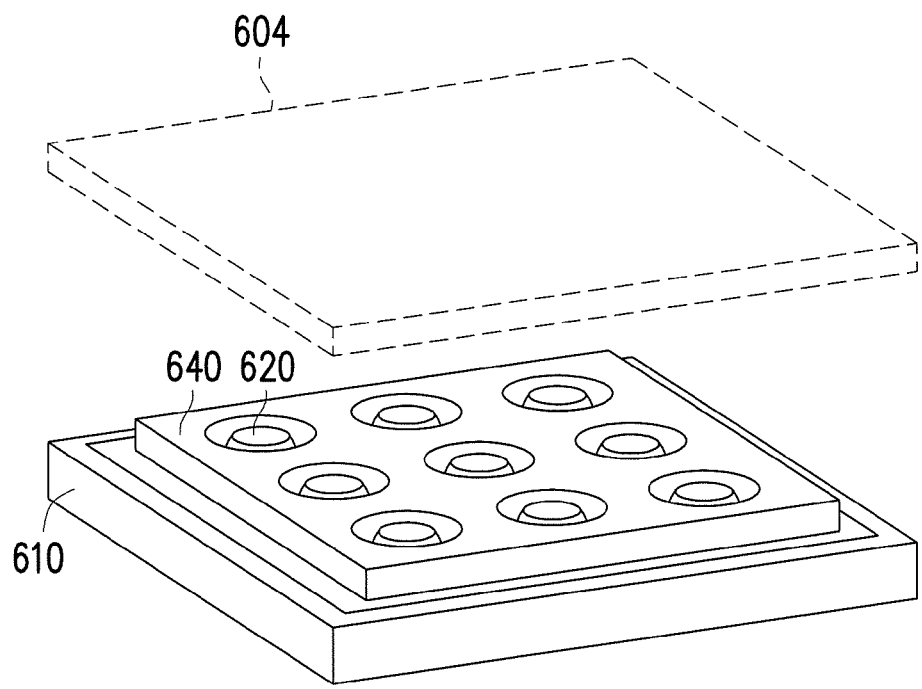

Then, as shown in FIG. 10D, the composite sealing structure SLB on the remained temporary carrier substrate 606 may be adhered to the substrate 610. The substrate 610 is similar to the aforementioned substrate 510 and has contacts (not shown) to be electrically connected to the conductive adhesive patterns 620. In this way, the conductive adhesive patterns 620 may serve as media of the substrate 610 for electrically connecting external assemblies. Then, in FIG. 10E, the remained temporary carrier substrate 606 is removed to expose the conductive adhesive patterns 620 and the sealing layer 640.

When the substrate 610 is bonded to another assembly through the composite sealing structure SLB, the conductive adhesive patterns 620 may serve as media for electrically connecting the substrate 610 to the other assembly. Therefore, the composite sealing structure SLB may be applied to the light-emitting assembly 100 of FIG. 1 and FIG. 3 to replace the composite sealing structure SL, and the substrate 610 in FIG. 10E may be regarded as the second substrate 150 of FIG. 1. Meanwhile, the moisture blocking feature of the sealing layer 640 may provide a sealing property that is the same as that of the sealing layer 180 to prevent deterioration or service life reduction of the light-emitting layer 130 caused by moisture invasion. Moreover, the composite sealing structure SLB may be applied in the light-emitting assembly 200 of FIG. 4, where the conductive adhesive patterns 620 of FIG. 10E replace the second conductive member 270 of FIG. 4, and the sealing layer 640 of FIG. 10E replaces the sealing layer 180 of FIG. 4. In this way, the composite sealing structure SLB may provide an electrical conduction function and a moisture barrier function in the light-emitting assembly 200 of FIG. 4.

Figure 11:
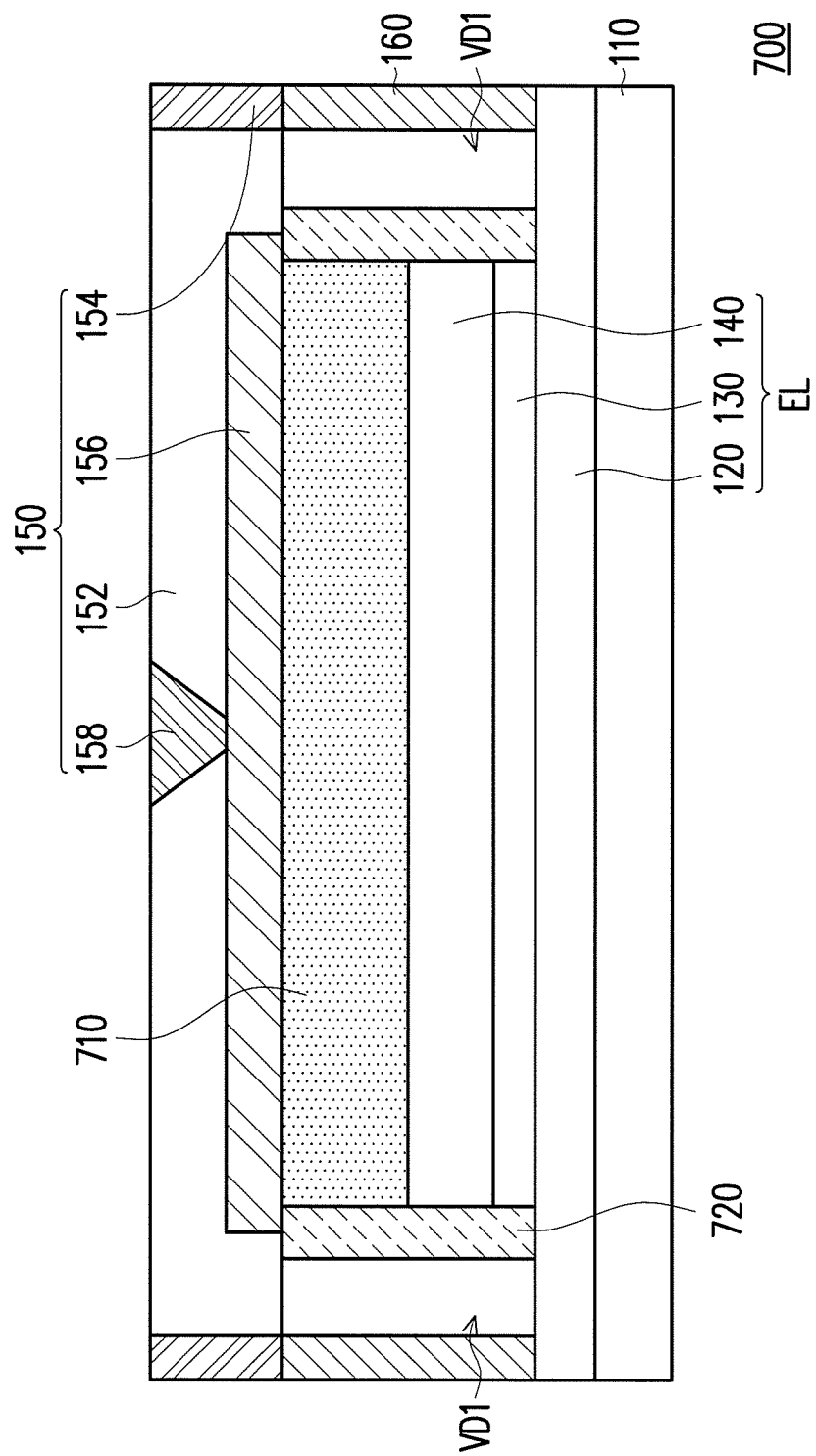
FIG. 11 is a cross-sectional view of a light-emitting assembly according to still another embodiment of the disclosure.

FIG. 11 is a cross-sectional view of a light-emitting assembly according to still another embodiment of the disclosure. Referring to FIG. 11, the light-emitting assembly 700 includes the first substrate 110, the first electrode layer 120, the light-emitting layer 130, the second electrode layer 140, the second substrate 150, the first conductive member 160, a conductive package adhesive layer 710 and a lateral package adhesive layer 720. Configuration relationship of the first substrate 110, the first electrode layer 120, the light-emitting layer 130, the second electrode layer 140, the second substrate 150 and the first conductive member 160 is similar to that of the embodiment of FIG. 1 and FIG. 3, so that the description of the aforementioned embodiment may be referred to help understanding the configuration relationship of the components. The first electrode layer 120, the light-emitting layer 130 and the second electrode layer 140 are sequentially stacked on the first substrate 110 to construct the light-emitting structure EL. The conductive package adhesive layer 710 is disposed between the light-emitting structure EL and the second substrate 150 to package the light-emitting structure EL between the first substrate 110 and the second substrate 150. The second substrate 150 includes the insulating matrix 152 and the first circuit 154 and the second circuit 156 disposed on the insulating matrix 152. The first conductive member 160 is located between the first substrate 110 and the second substrate 150, and the first electrode layer 120 is electrically connected to the first circuit 154 in the second substrate 150 through the first conductive member 160. The lateral package adhesive layer 720 seals sidewalls of the light-emitting layer 130 and the second electrode layer 140 in the light-emitting structure EL, and is located between the second substrate 150 and the first electrode layer 120. The second substrate 150 may be selectively configured with the heat conducting pattern 158, and the heat conducting pattern 158 is connected to the second circuit 156, such that the heat generated during the operation of the light-emitting structure EL is led out through a heat conducting function of the heat conducting pattern 158, which avails maintaining or prolonging a service life of the light-emitting assembly 700.

In the present embodiment, the whole conductive package adhesive layer 710 may provide a conduction function to serve as a second conductive member for electrically conducting the second electrode layer 140 and the second circuit 156. Meanwhile, the conductive package adhesive layer 710 is substantially disposed within an area of the second electrode layer 140 without exceeding the area of the second electrode layer 140. Moreover, the conductive package adhesive layer 710 may have the anti-water-oxygen function. In overall, a water vapour transmission rate of the conductive package adhesive layer 710 may be smaller than or equal to 6 g/m$^2$/day. Moreover, the light-emitting assembly 700 configured with the conductive package adhesive layer 710 is required to maintain for more than 1000 hours without causing deterioration under a test environment with a temperature of 60° C. and a relative humidity of 90%, so as to achieve enough reliability.

The conductive package adhesive layer 710 may take an adhesive material having the anti-water-oxygen function as a matrix, and conductive particles are doped into the matrix to construct the conductive package adhesive layer 710. In an embodiment, the matrix includes unsaturated polyester, epoxy resin, bismaleimide, polyimide, thermoplastic polymer resin, etc., or a material with a molecular structure carrying 1 or 2 epoxy groups. The matrix may be added with a hardening agent to cause a crosslinking reaction and to have a water-oxygen blocking function, where the hardening agent is, for example, aliphatic amines, polyamide, cycloaliphatic amines, aromatic amines, acid anhydrides, lewis acid, imidazoles, dicyandiamide, —NH$_2$, hyperoxide, —OH, etc. In an embodiment, the matrix may contain catalyst to decrease a hardening temperature, where the catalyst may include BF$_3$, (CH$_3$)$_2$NH. Further, in order to improve a mechanical property, the matrix may be added with carboxy-terminated polybutadiene acrylonitrile (CTBN) or amino-terminated polybutadiene acrylonitrile (ATBN). In order to implement water resistance and conductivity, the conductive particles include conductive polymers, for example, polyacetylene, polythiophene, polypyrrole, polyaniline, polyphenylene, etc. The conductive particles can also be one of metal particles, carbon, graphite and conductive fiber.

The lateral package adhesive layer 720 is made of an insulating material without causing electrical conduction between the first electrode layer 120 and the second electrode layer 140. Moreover, based on different fabrication methods, a void VD1 or none void can selectively exist between the lateral package adhesive layer 720 and the first conductive member 160. The material of the lateral package adhesive layer 720 may have a moisture barrier property and may be a curable material. In an embodiment, the material of the lateral package adhesive layer 720 may include a resin material and a hygroscopic material. The resin material includes epoxy resin, acrylic resin, polyurethane resin, or other resin materials. The hygroscopic material includes superabsorbent polymer, inorganic compound, porous material, etc. The superabsorbent polymer is, for example, sodium polyacrylate, sodium acrylonitrile, polyacrylamide, etc. The inorganic compound includes calcium oxide, barium oxide, strontium oxide, etc. The porous material, for example, includes zeolite or ceramic material.

Figure 12:
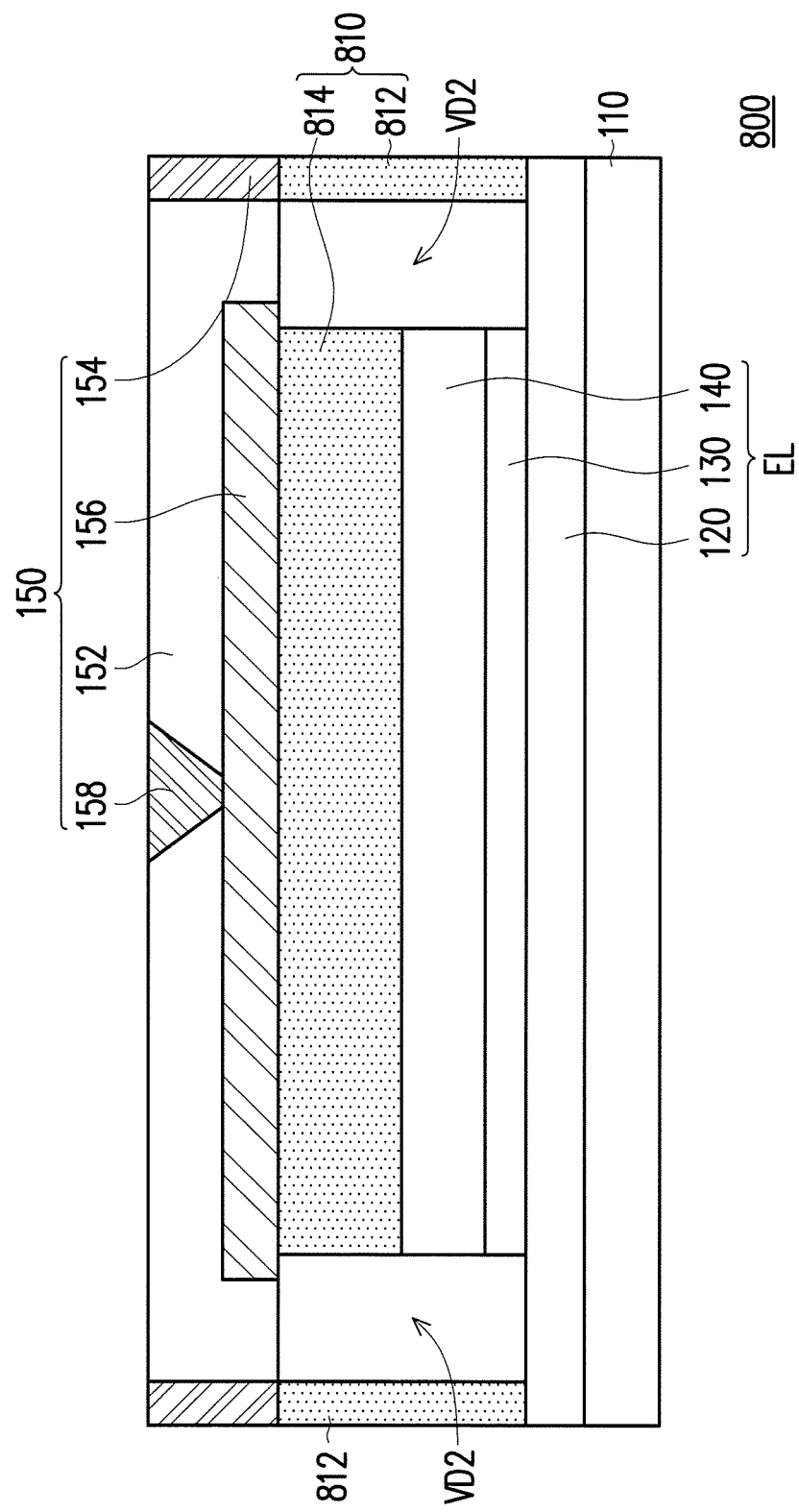
FIG. 12 is a cross-sectional view of a light-emitting assembly according to still another embodiment of the disclosure.

FIG. 12 is a cross-sectional view of a light-emitting assembly according to still another embodiment of the disclosure. Referring to FIG. 12, the light-emitting assembly 800 includes the first substrate 110, the first electrode layer 120, the light-emitting layer 130, the second electrode layer 140, the second substrate 150 and a conductive package adhesive layer 810. Configuration relationship of the first substrate 110, the first electrode layer 120, the light-emitting layer 130, the second electrode layer 140 and the second substrate 150 is similar to that of the embodiment of FIG. 1 and FIG. 3, so that the description of the aforementioned embodiment can be referred to help understanding the configuration relationship of the components.

To be specific, the first electrode layer 120, the light-emitting layer 130 and the second electrode layer 140 are sequentially stacked on the first substrate 110 to construct the light-emitting structure EL. The conductive package adhesive layer 810 is disposed between the light-emitting structure EL and the second substrate 150 to package the light-emitting structure EL between the first substrate 110 and the second substrate 150. The second substrate 150 includes the insulating matrix 152 and the first circuit 154 and the second circuit 156 disposed on the insulating matrix 152. The conductive package adhesive layer 810 includes a first conductive package adhesive pattern 812 and a second conductive package adhesive pattern 814. The first conductive package adhesive pattern 812 is located between the first substrate 110 and the second substrate 150, and the first electrode layer 120 is electrically connected to the first circuit 154 in the second substrate through the first conductive package adhesive pattern 812. The second conductive package adhesive pattern 814 is located between the second electrode layer 140 and the second substrate 150 to electrically connect the second electrode layer 140 and the second circuit 156. The second substrate 150 may be selectively configured with the heat conducting pattern 158, and the heat conducting pattern 158 is connected to the second circuit 156, such that the heat generated during the operation of the light-emitting structure EL is led out through a heat conducting function of the heat conducting pattern 158, which avails maintaining or prolonging a service life of the light-emitting assembly 800.

Since the conductive package adhesive layer 810 is conductive, the first conductive package adhesive pattern 812 and the second conductive package adhesive pattern 814 are required to be isolated from each other to provide independent conducting paths. In the present embodiment, the first conductive package adhesive pattern 812 and the second conductive package adhesive pattern 814 are spaced by a void VD2 to avoid electrical short circuit there between. Moreover, the second conductive package adhesive pattern 814 is used for independently providing an electrical conduction path of the second electrode layer 140, and the second conductive package adhesive pattern 814 may be entirely disposed within the area of the second electrode layer 140 without exceeding the area of the second electrode layer 140. In other words, in the present embodiment, the first conductive package adhesive pattern 812 may serve as the first conductive member for electrically conducting the first electrode layer 120 and the first circuit 154, and the second conductive package adhesive pattern 814 may serve as the second conductive member for electrically conducting the second electrode layer 140 and the second circuit 156.

Besides the conducting property, the conductive package adhesive layer 810 may have the moisture barrier function. A material of the conductive package adhesive layer 810 may be similar to the conductive package adhesive layer 710 of FIG. 11, so that detail thereof is not repeated. Since the conductive package adhesive layer 810 has the moisture barrier feature, the first conductive package adhesive pattern 812 may prevent lateral moisture invasion to protect the light-emitting layer 130. Therefore, the light-emitting assembly 800 having the first conductive package adhesive pattern 812 may selectively omit the lateral package adhesive, so as to simplify the structure and the fabrication process. However, in other embodiments, in order to further improve the lateral moisture barrier effect, under the structure of the light-emitting assembly 800, the lateral package adhesive layer 720 of FIG. 11 may be further configured.

Figure 13:
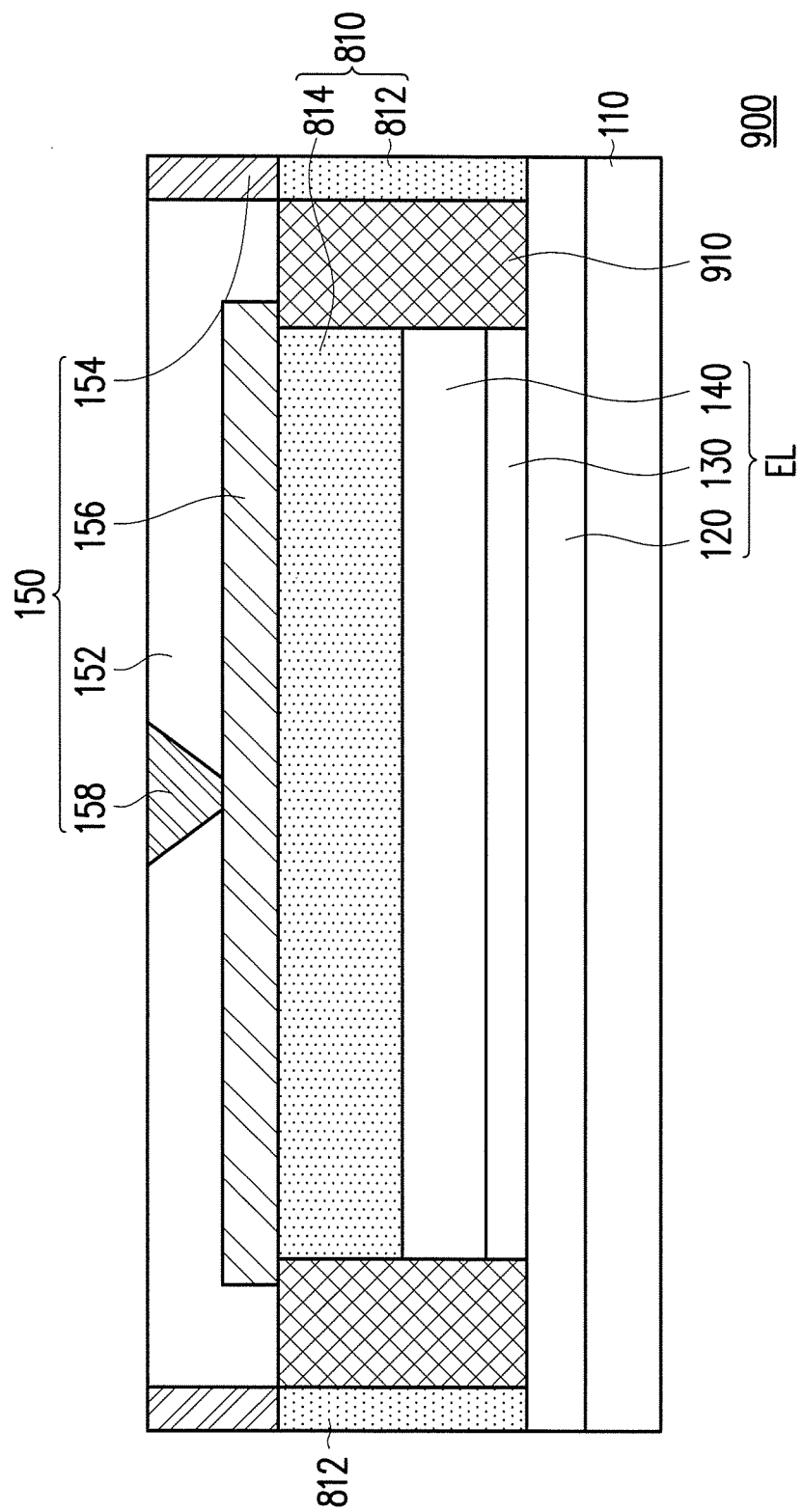
FIG. 13 is a cross-sectional view of a light-emitting assembly according to still another embodiment of the disclosure.

FIG. 13 is a cross-sectional view of a light-emitting assembly according to still another embodiment of the disclosure. Referring to FIG. 13, the light-emitting assembly 900 is similar to the light-emitting assembly 800 of FIG. 12, and includes the first substrate 110, the first electrode layer 120, the light-emitting layer 130, the second electrode layer 140, the second substrate 150 and the conductive package adhesive layer 810. Moreover, the light-emitting assembly 900 further includes a package adhesive pattern 910 located between the first conductive package adhesive pattern 812 and the second conductive package adhesive pattern 814. In the present embodiment, no void exists between the first conductive package adhesive pattern 812 and the second conductive package adhesive pattern 814, but the package adhesive pattern 910 is filled there between. The material of the package adhesive pattern 910 and the material of the conductive package adhesive layer 810 may include the same matrix. Nevertheless, the package adhesive pattern 910 does not include conductive particles and the conductive package adhesive layer 810 includes conductive particles. Namely, the package adhesive pattern 910 and the conductive package adhesive layer 810 may have similar moisture barrier capability, while the package adhesive pattern 910 have an insulation property and the conductive package adhesive layer 810 have a conductive property.

In an embodiment, the package adhesive pattern 910 and the conductive package adhesive layer 810 may be first fabricated on a same temporary carrier substrate through different screen printing steps. Then, the package adhesive pattern 910 and the conductive package adhesive layer 810 are adhered to the second substrate 150, and the conductive package adhesive layer 810 corresponds to the first circuit 154 and the second circuit 156. Subsequently, the temporary carrier substrate is removed, and the first substrate 110 and the second substrate 150 are assembled through the package adhesive pattern 910 and the conductive package adhesive layer 810 to construct the light-emitting assembly 900. Since the package adhesive pattern 910 is not doped with the conductive particles and the conductive package adhesive layer 810 is doped with the conductive particles, during a curing process, the package adhesive pattern 910 and the conductive package adhesive layer 810 are immiscible, such that the package adhesive pattern 910 and the conductive package adhesive layer 810 are not mixed to respectively locate at desired configuration positions.

Figure 14:
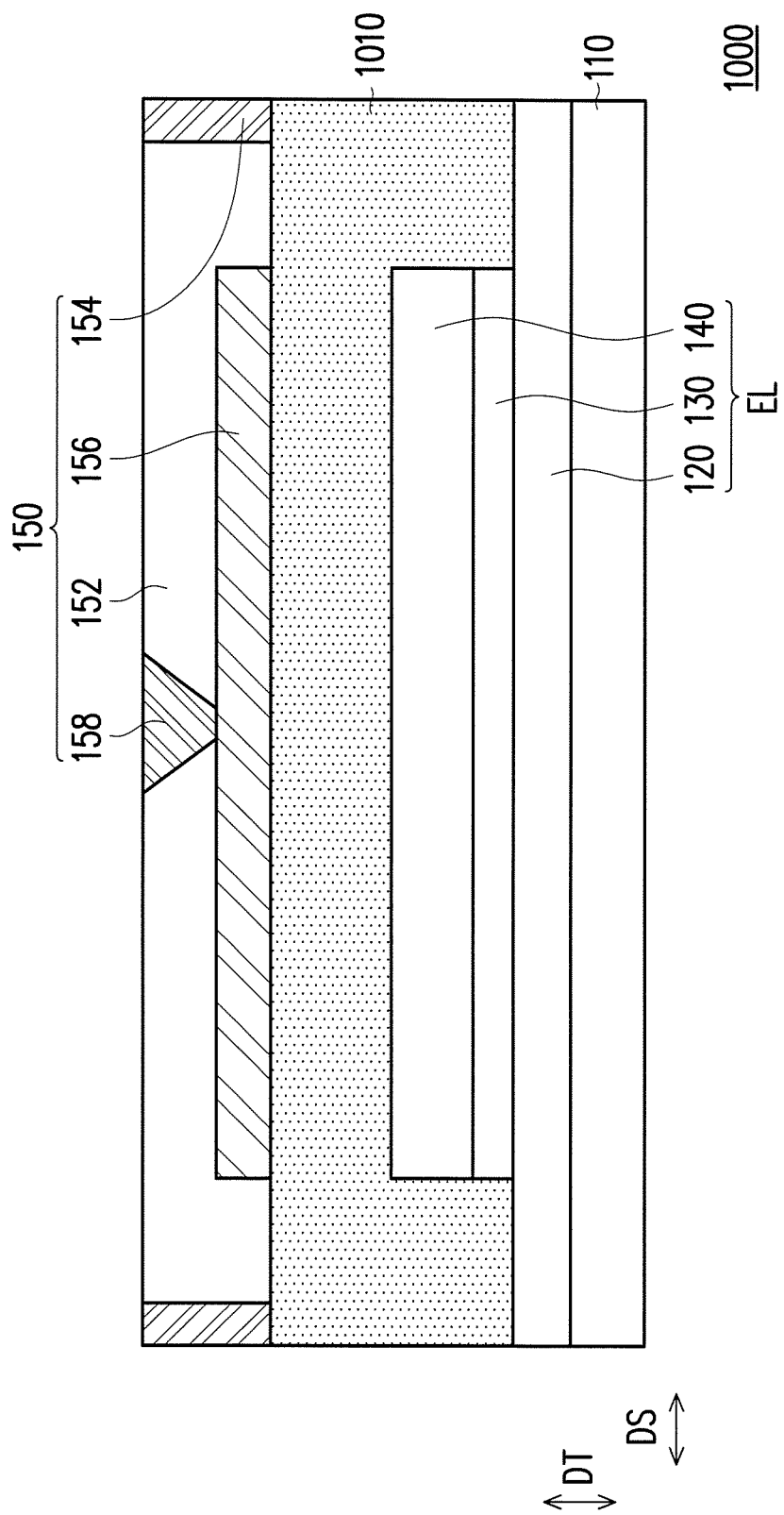
FIG. 14 is a cross-sectional view of a light-emitting assembly according to still another embodiment of the disclosure.

FIG. 14 is a cross-sectional view of a light-emitting assembly according to still another embodiment of the disclosure. In FIG. 14, the light-emitting assembly 1000 includes the first substrate 110, the first electrode layer 120, the light-emitting layer 130, the second electrode layer 140, the second substrate 150 and an anisotropic conductive package adhesive layer 1010. Configuration relationship of the first substrate 110, the first electrode layer 120, the light-emitting layer 130, the second electrode layer 140 and the second substrate 150 is similar to that of the embodiment of FIG. 1 and FIG. 3, so that the description of the aforementioned embodiment may be referred to help understanding the configuration relationship of the components.

In the present embodiment, the anisotropic conductive package adhesive layer 1010 is continuously distributed between the first substrate 110 and the second substrate 150 to seal the light-emitting structure EL and implement electrical connection between the first electrode layer 120 and the first circuit 154 and electrical connection between the second electrode layer 140 and the second circuit 156. Namely, the anisotropic conductive package adhesive layer 1010 is required to have a sealing effect, a moisture barrier effect and an electrical conduction effect. Moreover, an electric signal of the first electrode layer 120 and an electrical signal of the second electrode layer 140 have to be independent to each other. Therefore, the anisotropic conductive package adhesive layer 1010 is set to avoid providing electrical conduction property along a parallel direction DS parallel to the first substrate 110 and the second substrate 150. In other words, the anisotropic conductive package adhesive layer 1010 provides a directional electrical conduction property, and particularly provides the electrical conduction property along a thickness direction DT of the first substrate 110 and the second substrate 150. In this way, although the anisotropic conductive package adhesive layer 1010 is continuously disposed between the first substrate 110 and the second substrate 150 and contacts the first electrode layer 120, the second electrode layer 140, the first circuit 154 and the second circuit 156, the electrical transmission between the first electrode layer 120 and the first circuit 154 may be independent to the electrical transmission between the second electrode layer 140 and the second circuit 156. Moreover, in order to ensure that the second circuit 156 is only electrically connected to the second electrode layer 140 without electrically connecting the first electrode layer 120, a distributed area of the second circuit 156 may be set to be completely within the area of the second electrode layer 140 without exceeding the area of the second electrode layer 140.

In the present embodiment, the anisotropic conductive package adhesive layer 1010 may include a matrix and anisotropic conductive particles. In an embodiment, the matrix includes unsaturated polyester, epoxy resin, bismaleimide, polyimide, thermoplastic polymer resin, etc., or a material with a molecular structure carrying 1 or 2 epoxy groups. The matrix may be added with a hardening agent to cause a crosslinking reaction and to have a water-oxygen blocking function, where the hardening agent is, for example, aliphatic amines, polyamide, cycloaliphatic amines, aromatic amines, acid anhydrides, lewis acid, imidazoles, dicyandiamide, —NH$_2$, hyperoxide, —OH, etc. In an embodiment, the matrix may contain catalyst to decrease a hardening temperature, where the catalyst may include BF$_3$, (CH$_3$)$_2$NH. Further, in order to improve a mechanical property, the matrix may be added with carboxy-terminated polybutadiene acrylonitrile (CTBN) or amino-terminated polybutadiene acrylonitrile (ATBN). The anisotropic conductive particles are used for providing the electrical transmission path in the thickness direction DT and avoiding the electrical transmission in the parallel direction DS. The anisotropic conductive package adhesive layer 1010 may be continuously and entirely coated between the first substrate 110 and the second substrate 150, and simultaneously has the moisture barrier function and the electrical transmission function in a specified direction. Therefore, the light-emitting assembly 1000 has advantages of simple manufacturing process, simple structure, etc.

Figure 15A:
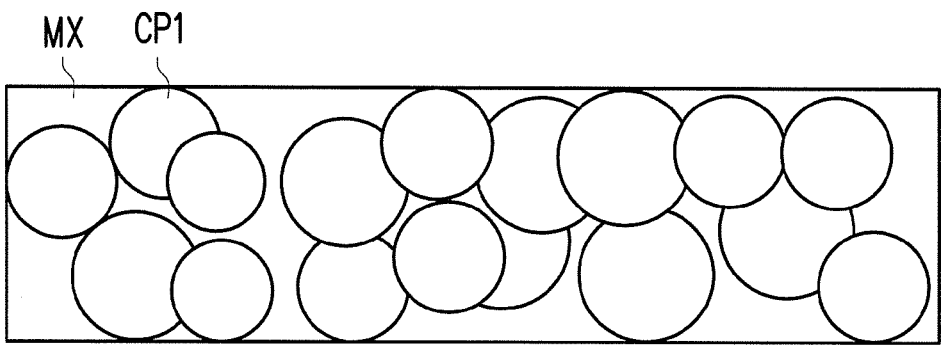
FIG. 15A to FIG. 15C are schematic diagrams of different conductive package adhesive layers.
Figure 15B:
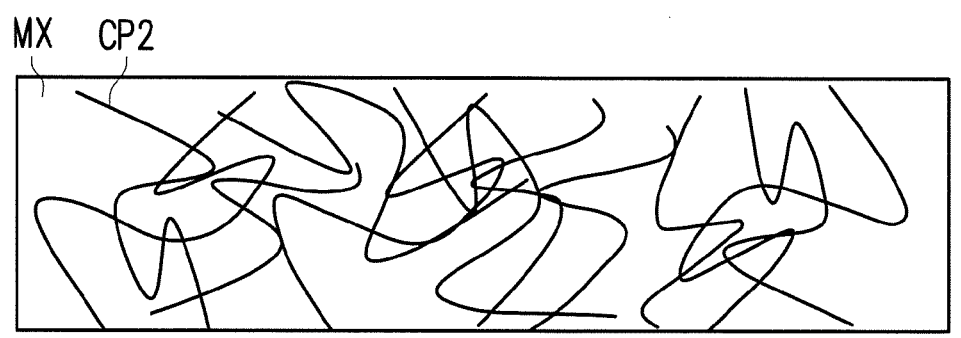
Figure 15C:
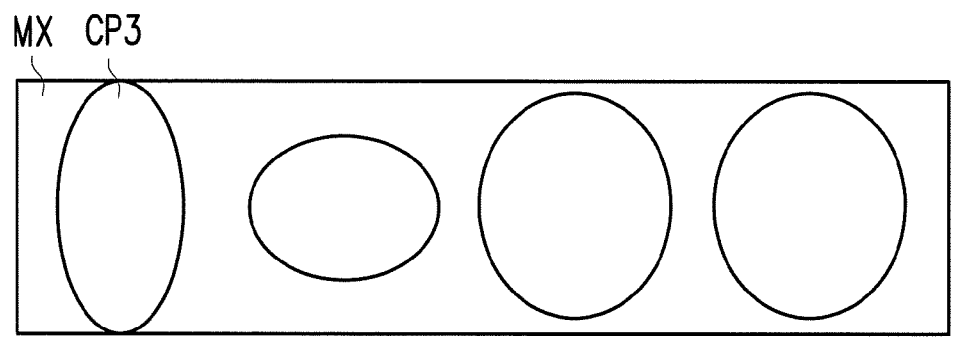

FIG. 15A to FIG. 15C are schematic diagrams of different conductive package adhesive layers. In FIG. 15A, the conductive package adhesive layer CS1 includes a matrix MX and conductive particles CP1 doped into the matrix MX, and the conductive particles CP1 may be composed of metal, alloy, compound or organic compound with conductivity complied with an electrical transmission requirement. The conductive particles CP1 may provide electrical transmission property of various directions. In FIG. 15B, the conductive package adhesive layer CS2 includes the matrix MX and conductive particles CP2 doped into the matrix MX, where the conductive particles CP2 are fiber-like. The fiber-like conductive particles CP2 may be polymer fiber coated with a conductive material on surface to provide the required conductive property. The conductive package adhesive layer CS1 of FIG. 15A and the conductive package adhesive layer CS2 of FIG. 15B may be applied to the embodiments of FIG. 11 to FIG. 13 to serve as the conductive package adhesive layer 710 or 810. In FIG. 15C, the conductive package adhesive layer CS3 includes the matrix MX and conductive particles CP3 doped into the matrix MX, where the conductive particles CP3 has obviously higher electrical transmission property along a specific direction and has obviously lower electrical transmission property along other directions. Therefore, the conductive particles CP3 are substantially anisotropic conductive particles, and the conductive package adhesive layer CS3 may be applied to the light-emitting assembly of FIG. 11 to FIG. 14 to serve as the electrical conduction medium between the first substrate 110 and the second substrate 150.

In summary, the light-emitting assembly of the embodiments of the disclosure may be manufactured through simple assembling steps (for example, one lamination step may be perform to complete manufacturing the light-emitting assembly), which avails improving the efficiency of manufacturing the light-emitting assembly and save a manufacturing time. Meanwhile, in the light-emitting assembly of the embodiments of the disclosure, the light-emitting structure may be connected to the corresponding circuit on the second substrate without extending the two electrode layers electrically independent to each other on the first substrate to a same plane position, which avails decreasing an area of the peripheral region outside the light-emitting layer to achieve a narrow border structure design. In an embodiment of the disclosure, the light-emitting assembly may adopt void packaging to save a material cost of the sealing layer and simplify the overall fabrication flow. In some embodiments, the conductive member connected between the second substrate and the electrode of the light-emitting structure may be disposed in a thin substrate, and the conductive member may achieve ideal conduction efficiency and property through material and stacked layer adjustment. In some embodiments, the metal layer in the second substrate may provide the moisture barrier function for the light-emitting layer, which avails decreasing a chance that the light-emitting layer is damaged due to moisture invasion.

In some embodiments of the disclosure, the sealing layer used for blocking moisture and the conductive adhesive pattern used for providing electrical transmission may be integrated on a same temporary carrier substrate. Therefore, the method for manufacturing the light-emitting assembly may only adopt one lamination step to form the sealing layer used for blocking moisture and the conductive adhesive patterns used for providing electrical transmission on the circuit board. In some other embodiments of the disclosure, the sealing layer used for blocking moisture may also have a conduction effect, such that the manufacturing process and the structure of the light-emitting assembly are further simplified.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light-emitting assembly, comprising:
   a first substrate;
   a first electrode layer, disposed on the first substrate;
   a light-emitting layer, disposed on the first electrode layer;
   a second electrode layer, disposed on the light-emitting layer, wherein an area of the second electrode layer is entirely located within an area of the light-emitting layer;
   a second substrate, having a barrier metal layer, a first circuit and a second circuit, wherein the second electrode layer is located between the second substrate and the light-emitting layer, the barrier metal layer is disposed between the second circuit and the second electrode layer, and an area of the barrier metal layer covers the area of the light emitting layer;
   a first conductive member, disposed between the first substrate and the second substrate, wherein the first electrode layer is electrically connected to the first circuit on the second substrate through the first conductive member; and
   a second conductive member, disposed between the first substrate and the second substrate, wherein the second electrode layer is electrically connected to the second circuit on the second substrate through the second conductive member, and the second conductive member is located within the area of the second electrode layer.

2. The light-emitting assembly as claimed in claim 1, wherein a sheet resistance of at least one of the first conductive member and the second conductive member is smaller than or equal to 100 ohm/square unit.

3. The light-emitting assembly as claimed in claim 1, wherein a water vapour transmission rate of at least one of the first conductive member and the second conductive member is smaller than or equal to $10^{-2}$ g/m$^2$/day.

4. The light-emitting assembly as claimed in claim 1, further comprising:
   a sealing layer, disposed between the second electrode layer and the second substrate, wherein the second conductive member is surrounded by the sealing layer.

5. The light-emitting assembly as claimed in claim 4, further comprising:
   a moisture barrier layer, wherein the light-emitting layer and the second electrode layer are wrapped between the moisture barrier layer and the first electrode layer, wherein the second conductive member penetrates through the moisture barrier layer to electrically connect the second electrode layer.

6. The light-emitting assembly as claimed in claim 4, wherein the second conductive member comprises a plurality of conductive patterns, and the second electrode layer comprises a plurality of electrode patterns independent to each other in contours, and the conductive patterns are respectively connected to the electrode patterns.

7. The light-emitting assembly as claimed in claim 6, wherein the conductive patterns are electrically connected to each other through the second circuit.

8. The light-emitting assembly as claimed in claim 4, wherein a material of the sealing layer comprises at least one of a photo curable material, a heat curable material, and a pressure curable material.

9. The light-emitting assembly as claimed in claim 4, wherein the barrier metal layer contacts the sealing layer.

10. The light-emitting assembly as claimed in claim 9, wherein the barrier metal layer has an opening corresponding to the second conductive member, the second circuit has a protrusion portion extended to the opening, such that the second conductive member is electrically connected to the protrusion portion in the opening, and the barrier metal layer is electrically isolated to the second circuit and electrically isolated to the second conductive member.

11. The light-emitting assembly as claimed in claim 9, wherein the barrier metal layer is connected to a ground potential.

12. The light-emitting assembly as claimed in claim 4, wherein the sealing layer has at least one opening, and the second conductive member is located in the at least one opening.

13. The light-emitting assembly as claimed in claim 12, wherein a gap is formed between the sealing layer and the second conductive member located in the at least one opening.

14. The light-emitting assembly as claimed in claim 1, wherein the second substrate further comprises at least one heat conducting pattern, the at least one heat conducting pattern is connected to the second circuit, and the second circuit is located between the heat conducting pattern and the second conductive member.

15. The light-emitting assembly as claimed in claim 1, wherein an area of the first electrode layer is greater than the area of the second electrode layer, and the first electrode layer extends outward from the second electrode layer to define a peripheral region, and the first conductive member is located at the peripheral region.

16. The light-emitting assembly as claimed in claim 1, wherein the second substrate comprises an insulating matrix, and the first circuit and the second circuit are embedded in the insulating matrix.

17. The light-emitting assembly as claimed in claim 1, wherein at least one of the first conductive member and the second conductive member is composed of a conductive package adhesive layer, and the conductive package adhesive layer comprises a matrix and a plurality of conductive particles doped in the matrix.

18. The light-emitting assembly as claimed in claim 17, wherein the conductive particles comprise at least one of conductive polymers, metal particles, carbon, and conductive fiber.

19. The light-emitting assembly as claimed in claim 17, wherein the conductive particles comprise anisotropic conductive particles.

20. The light-emitting assembly as claimed in claim 17, further comprising:
a lateral package adhesive layer, located between the second substrate and the first electrode layer, and sealing sidewalls of the light-emitting layer and the second electrode layer.

21. The light-emitting assembly as claimed in claim 17, wherein the conductive package adhesive layer comprises a first conductive package adhesive pattern serving as the first conductive member and a second conductive package adhesive pattern serving as the second conductive member, and a gap is formed between the first conductive package adhesive pattern and the second conductive package adhesive pattern.

22. The light-emitting assembly as claimed in claim 21, further comprising:
a package adhesive pattern, disposed in the gap, and having an insulation property, and a material of the package adhesive pattern comprising a material of the matrix.

23. The light-emitting assembly as claimed in claim 1, further comprising:
a first conductive bonding member and a second conductive bonding member, wherein the first conductive bonding member is disposed between the first conductive member and the first electrode layer, the second conductive bonding member is disposed between the second conductive member and the second electrode layer, and a gap exists between the first conductive bonding member and the light-emitting layer, and the first conductive bonding member and the second conductive bonding member respectively comprise a conductive adhesive or a solder paste.

24. A light-emitting assembly, comprising:
a first substrate;
a first electrode layer, disposed on the first substrate;
a light-emitting layer, disposed on the first electrode layer;
a second electrode layer, disposed on the light-emitting layer, wherein an area of the second electrode layer is entirely located within an area of the light-emitting layer;
a second substrate, having a first circuit and a second circuit, wherein the second electrode layer is located between the second substrate and the light-emitting layer;
a first conductive member, disposed between the first substrate and the second substrate, wherein the first electrode layer is electrically connected to the first circuit on the second substrate through the first conductive member; and
a second conductive member, disposed between the first substrate and the second substrate, wherein the second electrode layer is electrically connected to the second circuit on the second substrate through the second conductive member, and the second conductive member is located within the area of the second electrode layer, and wherein the second conductive member has a contact terminal, the contact terminal is proximate to the second electrode layer, and the contact terminal comprises a first material layer, a second material layer and a third material layer sequentially stacked from the second substrate towards the second electrode layer.

* * * * *